(12) United States Patent
Landman et al.

(10) Patent No.: US 12,320,844 B2
(45) Date of Patent: *Jun. 3, 2025

(54) INTEGRATED CIRCUIT PROFILING AND ANOMALY DETECTION

(71) Applicant: PROTEANTECS LTD., Haifa (IL)

(72) Inventors: Evelyn Landman, Haifa (IL); Yahel David, Kibbutz Gazit (IL); Eyal Fayneh, Givatayim (IL); Shai Cohen, Haifa (IL); Yair Talker, Binyamina (IL)

(73) Assignee: PROTEANTECS LTD., Haifa (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/369,171

(22) Filed: Sep. 17, 2023

(65) Prior Publication Data

US 2024/0003968 A1 Jan. 4, 2024

Related U.S. Application Data

(63) Continuation of application No. 17/047,243, filed as application No. PCT/IL2019/050433 on Apr. 16, 2019, now Pat. No. 11,762,013.

(Continued)

(51) Int. Cl.
*G01R 31/317* (2006.01)
*G01R 31/28* (2006.01)
(Continued)

(52) U.S. Cl.
CPC ... *G01R 31/31707* (2013.01); *G01R 31/2803* (2013.01); *G01R 31/2894* (2013.01);
(Continued)

(58) Field of Classification Search
CPC .......... G01R 31/31707; G01R 31/2803; G01R 31/2894; G01R 31/31718; G06N 3/08; G06N 7/01

See application file for complete search history.

(56) References Cited

U.S. PATENT DOCUMENTS 4,555,663 A 11/1985 Shimizu
5,548,539 A 8/1996 Vlach et al.
(Continued)

FOREIGN PATENT DOCUMENTS

CN 1886668 A 12/2006
CN 101014991 A 8/2007
(Continued)

OTHER PUBLICATIONS

Mridul Agarwal et al, "Circuit Failure Prediction and Its Application to Transistor Aging"; 5th IEEE VLSI Test Symposium (VTS'07), pp. 277-286, May 6-10, 2007. doi: 10.1109/VTS.2007.22.
(Continued)

*Primary Examiner* — Mujtaba M Chaudry
(74) *Attorney, Agent, or Firm* — The Roy Gross Law Firm, LLC; Roy D. Gross

(57) ABSTRACT

A computerized method for IC classification, outlier detection and/or anomaly detection comprising using at least one hardware processor for testing each of the plurality of ICs in accordance with an IC design on a wafer, wherein the IC design comprises a plurality of sensors. The at least one hardware processor is used for testing each of the plurality of ICs by: collecting a plurality of sensor values, the plurality of sensor values including sensor values from each of the plurality of sensors; comparing the plurality of sensor values to a classification scheme, thereby obtaining a classification for each tested IC; and recording the classification of the tested IC.

20 Claims, 17 Drawing Sheets

Related U.S. Application Data

(60) Provisional application No. 62/657,986, filed on Apr. 16, 2018.

(51) Int. Cl.
  *G06N 3/08* (2023.01)
  *G06N 7/01* (2023.01)

(52) U.S. Cl.
  CPC ......... *G01R 31/31718* (2013.01); *G06N 3/08* (2013.01); *G06N 7/01* (2023.01)

(56) References Cited

U.S. PATENT DOCUMENTS

| | | |
|---|---|---|
| 5,748,509 A | 5/1998 | Fewster |
| 5,774,403 A | 6/1998 | Clark, II et al. |
| 5,818,251 A | 10/1998 | Intrater |
| 5,895,629 A | 4/1999 | Russell et al. |
| 5,956,497 A | 9/1999 | Ratzel et al. |
| 5,966,527 A | 10/1999 | Krivokapic et al. |
| 6,140,833 A | 10/2000 | Flietner et al. |
| 6,172,546 B1 | 1/2001 | Liu et al. |
| 6,182,253 B1 | 1/2001 | Lawrence et al. |
| 6,486,716 B1 | 11/2002 | Minami et al. |
| 6,586,921 B1 | 7/2003 | Sunter |
| 6,683,484 B1 | 1/2004 | Kueng et al. |
| 6,807,503 B2 * | 10/2004 | Ye .................... H01L 21/67276 438/18 |
| 6,873,926 B1 | 3/2005 | Diab |
| 6,882,172 B1 | 4/2005 | Suzuki et al. |
| 6,948,388 B1 | 9/2005 | Clayton et al. |
| 7,038,483 B1 | 5/2006 | Suzuki et al. |
| 7,067,335 B2 | 6/2006 | Weiner et al. |
| 7,254,507 B2 | 8/2007 | Dosho et al. |
| 7,288,958 B2 | 10/2007 | Takagi |
| 7,369,893 B2 | 5/2008 | Gunderson |
| 7,443,189 B2 | 10/2008 | Ramappa |
| 7,455,450 B2 | 11/2008 | Liu et al. |
| 7,501,832 B2 | 3/2009 | Spuhler et al. |
| 7,649,373 B2 | 1/2010 | Tokunaga |
| 7,701,246 B1 | 4/2010 | Plants et al. |
| 7,818,601 B2 | 10/2010 | LaBerge |
| 7,877,657 B1 | 1/2011 | Miller et al. |
| 7,940,862 B2 | 5/2011 | Tanaka et al. |
| 8,001,512 B1 | 8/2011 | White |
| 8,086,978 B2 | 12/2011 | Zhang et al. |
| 8,170,067 B2 | 5/2012 | Zerbe et al. |
| 8,279,976 B2 | 10/2012 | Lin et al. |
| 8,310,265 B2 | 11/2012 | Zjajo et al. |
| 8,365,115 B2 | 1/2013 | Liu et al. |
| 8,418,103 B2 | 4/2013 | Wang et al. |
| 8,479,130 B1 | 7/2013 | Zhang et al. |
| 8,633,722 B1 | 1/2014 | Lai |
| 8,825,158 B2 | 9/2014 | Swerdlow |
| 8,996,937 B2 | 3/2015 | Jain et al. |
| 9,275,706 B2 | 3/2016 | Tam |
| 9,424,952 B1 | 8/2016 | Seok et al. |
| 9,490,787 B1 | 11/2016 | Kho et al. |
| 9,536,038 B1 | 1/2017 | Quinton et al. |
| 9,564,883 B1 | 2/2017 | Quinton et al. |
| 9,564,884 B1 | 2/2017 | Quinton et al. |
| 9,632,126 B2 | 4/2017 | Yoon et al. |
| 9,714,966 B2 | 7/2017 | Chen et al. |
| 9,760,672 B1 | 9/2017 | Taneja et al. |
| 9,791,834 B1 | 10/2017 | Nassar et al. |
| 9,954,455 B2 | 4/2018 | Lin et al. |
| 9,977,078 B2 | 5/2018 | Loke et al. |
| 9,991,879 B2 | 6/2018 | Huang |
| 10,490,547 B1 | 11/2019 | Ali et al. |
| 10,509,104 B1 | 12/2019 | Dato |
| 10,530,347 B2 | 1/2020 | Tang et al. |
| 11,036,266 B2 | 6/2021 | Srivastava et al. |
| 11,081,193 B1 | 8/2021 | Tang |
| 11,409,323 B2 | 8/2022 | Herberholz et al. |
| 11,762,013 B2 * | 9/2023 | Landman ............... G06N 20/00 714/724 |
| 12,013,800 B1 | 6/2024 | Fayneh et al. |
| 2001/0013111 A1 | 8/2001 | Bishop et al. |
| 2004/0009616 A1 | 1/2004 | Huisman et al. |
| 2004/0015793 A1 | 1/2004 | Saxena et al. |
| 2004/0230385 A1 | 11/2004 | Bechhoefer et al. |
| 2004/0230396 A1 | 11/2004 | Ye et al. |
| 2004/0267479 A1 | 12/2004 | Querbach et al. |
| 2005/0053162 A1 | 3/2005 | Goishi |
| 2005/0104175 A1 | 5/2005 | Itano |
| 2005/0114056 A1 | 5/2005 | Patel et al. |
| 2005/0134350 A1 | 6/2005 | Huang et al. |
| 2005/0134394 A1 | 6/2005 | Liu |
| 2005/0154552 A1 | 7/2005 | Stroud et al. |
| 2005/0193302 A1 | 9/2005 | Arguelles et al. |
| 2005/0285646 A1 | 12/2005 | Rashid |
| 2006/0049886 A1 | 3/2006 | Agostinelli, Jr. et al. |
| 2006/0224374 A1 | 10/2006 | Kwon et al. |
| 2007/0110199 A1 | 5/2007 | Momtaz et al. |
| 2007/0182456 A1 | 8/2007 | Agarwal et al. |
| 2007/0288183 A1 | 12/2007 | Bulkes et al. |
| 2008/0071489 A1 | 3/2008 | Wissel |
| 2008/0074521 A1 | 3/2008 | Olsen |
| 2008/0144243 A1 | 6/2008 | Mariani et al. |
| 2008/0147355 A1 | 6/2008 | Fields et al. |
| 2008/0183409 A1 | 7/2008 | Roberts et al. |
| 2008/0186001 A1 | 8/2008 | Singh et al. |
| 2008/0186044 A1 | 8/2008 | Singh |
| 2008/0216033 A1 | 9/2008 | Bucossi et al. |
| 2008/0231310 A1 | 9/2008 | Vijayaraghavan |
| 2008/0262769 A1 | 10/2008 | Kadosh et al. |
| 2009/0027077 A1 | 1/2009 | Vijayaraghavan et al. |
| 2009/0044160 A1 | 2/2009 | Bueti et al. |
| 2009/0076753 A1 | 3/2009 | Vijayaraghavan et al. |
| 2009/0096495 A1 | 4/2009 | Keigo |
| 2009/0105978 A1 | 4/2009 | Schuttert et al. |
| 2009/0183043 A1 | 7/2009 | Niwa |
| 2009/0222775 A1 | 9/2009 | Idgunji et al. |
| 2009/0230947 A1 | 9/2009 | Sumita |
| 2009/0244998 A1 | 10/2009 | Kim et al. |
| 2009/0273550 A1 | 11/2009 | Vieri et al. |
| 2009/0278576 A1 | 11/2009 | Chakravarty |
| 2009/0306953 A1 | 12/2009 | Liu et al. |
| 2010/0153896 A1 | 6/2010 | Sewall et al. |
| 2010/0251046 A1 | 9/2010 | Mizuno et al. |
| 2010/0253382 A1 | 10/2010 | Wang et al. |
| 2011/0093830 A1 | 4/2011 | Chen et al. |
| 2011/0102091 A1 | 5/2011 | Yeric |
| 2011/0109377 A1 | 5/2011 | Fujibe et al. |
| 2011/0113298 A1 | 5/2011 | Van Den Eijnden |
| 2011/0169537 A1 | 7/2011 | Ma |
| 2011/0175658 A1 | 7/2011 | Nomura |
| 2011/0187433 A1 | 8/2011 | Baumann et al. |
| 2011/0267096 A1 | 11/2011 | Chlipala et al. |
| 2011/0295403 A1 | 12/2011 | Higuchi et al. |
| 2011/0315986 A1 | 12/2011 | Kaneda et al. |
| 2012/0025846 A1 | 2/2012 | Minas et al. |
| 2012/0038388 A1 | 2/2012 | Tseng et al. |
| 2012/0051395 A1 | 3/2012 | Chen et al. |
| 2012/0063524 A1 | 3/2012 | Stott |
| 2012/0074973 A1 | 3/2012 | Baldwin et al. |
| 2012/0163074 A1 | 6/2012 | Franca-Neto et al. |
| 2012/0170616 A1 | 7/2012 | Tsai et al. |
| 2012/0187991 A1 | 7/2012 | Sathe et al. |
| 2012/0212246 A1 | 8/2012 | Benjamin et al. |
| 2012/0217976 A1 | 8/2012 | Clarkson |
| 2012/0221906 A1 | 8/2012 | Shetty et al. |
| 2012/0242490 A1 | 9/2012 | Ramaswami |
| 2013/0088256 A1 | 4/2013 | Chlipala et al. |
| 2013/0226491 A1 | 8/2013 | Miguelanez, II et al. |
| 2013/0241690 A1 | 9/2013 | Wallace et al. |
| 2013/0293270 A1 | 11/2013 | Lee et al. |
| 2013/0335875 A1 | 12/2013 | Baumann |
| 2014/0132293 A1 | 5/2014 | Abadir et al. |
| 2014/0132315 A1 | 5/2014 | Sharma et al. |
| 2014/0143586 A1 | 5/2014 | Dalumi et al. |
| 2014/0184243 A1 | 7/2014 | Iyer et al. |
| 2014/0254734 A1 | 9/2014 | Abdelmoneum et al. |

(56) References Cited

U.S. PATENT DOCUMENTS

| | | |
|---|---|---|
| 2015/0061707 A1 | 3/2015 | Balasubramanian et al. |
| 2015/0061721 A1 | 3/2015 | Jeong |
| 2015/0077136 A1 | 3/2015 | Li |
| 2015/0121158 A1 | 4/2015 | Wang et al. |
| 2015/0199223 A1 | 7/2015 | Banerjee et al. |
| 2015/0332451 A1 | 11/2015 | Amzaleg et al. |
| 2015/0355033 A1 | 12/2015 | Zhang et al. |
| 2015/0365049 A1 | 12/2015 | Ozawa et al. |
| 2016/0033574 A1 | 2/2016 | Serrer et al. |
| 2016/0042784 A1 | 2/2016 | Rim et al. |
| 2016/0072511 A1 | 3/2016 | Maekawa |
| 2016/0087643 A1 | 3/2016 | Nozaki |
| 2016/0125434 A1* | 5/2016 | Kohn .............. G06Q 10/087 705/7.31 |
| 2016/0131708 A1 | 5/2016 | Huang et al. |
| 2016/0153840 A1 | 6/2016 | Huang et al. |
| 2016/0156176 A1 | 6/2016 | Kunz, Jr et al. |
| 2016/0164503 A1 | 6/2016 | Kim et al. |
| 2016/0203036 A1 | 7/2016 | Mezic et al. |
| 2016/0254804 A1 | 9/2016 | Meng |
| 2017/0038265 A1 | 2/2017 | Abdelmoneum et al. |
| 2017/0093399 A1 | 3/2017 | Atkinson et al. |
| 2017/0160339 A1 | 6/2017 | Jenkins |
| 2017/0179173 A1 | 6/2017 | Mandai et al. |
| 2017/0199089 A1 | 7/2017 | Fritchman et al. |
| 2017/0199228 A1 | 7/2017 | Hsieh et al. |
| 2017/0214516 A1 | 7/2017 | Rivaud et al. |
| 2017/0329391 A1 | 11/2017 | Jaffari et al. |
| 2017/0344102 A1 | 11/2017 | Kolla et al. |
| 2017/0345490 A1 | 11/2017 | Yoshimoto et al. |
| 2017/0364818 A1 | 12/2017 | Wu et al. |
| 2018/0034549 A1 | 2/2018 | Kikuchi |
| 2018/0109245 A1 | 4/2018 | Takagi |
| 2018/0183413 A1 | 6/2018 | Wong et al. |
| 2018/0365974 A1 | 12/2018 | Haas et al. |
| 2019/0019096 A1 | 1/2019 | Yoshida et al. |
| 2019/0117122 A1 | 4/2019 | Kurachi et al. |
| 2019/0128961 A1 | 5/2019 | Heron et al. |
| 2019/0162783 A1 | 5/2019 | Huang |
| 2019/0305074 A1 | 10/2019 | Kande et al. |
| 2020/0028514 A1 | 1/2020 | Hanke et al. |
| 2020/0203333 A1 | 6/2020 | Chen et al. |
| 2020/0209070 A1 | 7/2020 | Tang et al. |
| 2020/0309850 A1 | 10/2020 | Bismuth |
| 2020/0313664 A1 | 10/2020 | Azam et al. |
| 2021/0325455 A1 | 10/2021 | Fayneh et al. |
| 2021/0341535 A1 | 11/2021 | Hsieh et al. |
| 2022/0260630 A1 | 8/2022 | Fayneh et al. |
| 2022/0349935 A1 | 11/2022 | Fayneh et al. |
| 2023/0098071 A1 | 3/2023 | Chonnad et al. |

FOREIGN PATENT DOCUMENTS

| | | |
|---|---|---|
| CN | 101241429 A | 8/2008 |
| CN | 101344898 A | 1/2009 |
| CN | 102422169 A | 4/2012 |
| CN | 101915625 B | 7/2012 |
| CN | 102273077 B | 9/2014 |
| CN | 105210188 A | 12/2015 |
| CN | 106959400 A | 7/2017 |
| CN | 108534866 A | 9/2018 |
| CN | 113466670 A | 10/2021 |
| DE | 102007002253 A1 | 7/2007 |
| DE | 102014216786 B3 | 10/2015 |
| DE | 102012219971 A1 | 7/2016 |
| EP | 962991 A1 | 12/1999 |
| EP | 1262755 A1 | 12/2002 |
| EP | 2006784 A1 | 12/2008 |
| EP | 2060924 A1 | 5/2009 |
| EP | 2413150 A1 | 2/2012 |
| EP | 2770313 A1 | 8/2014 |
| JP | S57116228 A | 7/1982 |
| JP | 2000215693 A | 8/2000 |
| JP | 2002243800 A | 8/2002 |
| JP | 2008147245 A | 6/2008 |
| JP | 2009021348 A | 1/2009 |
| JP | 2009065533 A | 3/2009 |
| JP | 2009074921 A | 4/2009 |
| JP | 2011204328 A | 10/2011 |
| JP | 2012037238 A | 2/2012 |
| JP | 2012088322 A | 5/2012 |
| JP | 2014085348 A | 5/2014 |
| JP | 2016111563 A | 6/2016 |
| KR | 101232207 B1 | 2/2013 |
| KR | 2013110989 A | 10/2013 |
| KR | 20150073199 A | 6/2015 |
| TW | 200914841 A | 4/2009 |
| TW | 201614256 A | 4/2016 |
| TW | 201709669 A | 3/2017 |
| WO | 2005080099 A1 | 9/2005 |
| WO | 2013070218 A1 | 5/2013 |
| WO | 2013027739 A1 | 3/2015 |
| WO | 2019097516 A1 | 5/2019 |
| WO | 2019102467 A1 | 5/2019 |
| WO | 2019135247 A1 | 7/2019 |
| WO | 2019202595 A1 | 10/2019 |
| WO | 2019244154 A1 | 12/2019 |
| WO | 2020141516 A1 | 7/2020 |
| WO | 2020230130 A1 | 11/2020 |
| WO | 2021019539 A1 | 2/2021 |
| WO | 2021111444 A1 | 6/2021 |
| WO | 2021214562 A1 | 10/2021 |
| WO | 2022/009199 A1 | 1/2022 |
| WO | 2022215076 A1 | 10/2022 |
| WO | 2023238128 A1 | 12/2023 |
| WO | 2024/166103 A1 | 8/2024 |

OTHER PUBLICATIONS

Keith A. Bowman et al, "Energy-Efficient and Metastability-Immune Resilient Circuits for Dynamic Variation Tolerance"; IEEE Journal of Solid-State Circuits vol. 44, Issue 1, pp. 49-63, Jan. 2009.doi: 10.1109/JSSC.2008.2007148.

Shidhartha Das et al, "A Self-Tuning DVS Processor Using Delay-Error Detection and Correction"; IEEE Journal of Solid-State Circuits; vol. 41, Issue 4, pp. 792-804, Apr. 2006. doi: 10.1109/JSSC.2006.870912.

Shidhartha Das et al, "RazorII: In Situ Error Detection and Correction for PVT and SER Tolerance" 2008 IEEE International Solid-State Circuits Conference—Digest of Technical Papers, Feb. 3-7, 2008. doi: 10.1109/JSSC.2008.2007145.

Ramyanshu Datta et al, "On-Chip Delay Measurement for Silicon Debug"; GLSVLSI '04: Proceedings of the 14th ACM Great Lakes symposium on VLSI; pp. 145-148, Apr. 26-28, 2004. https://doi.org/10.1145/988952.988988.

Alan Drake et al, "A Distributed Critical-Path Timing Monitor for a 65nm High-Performance Microprocessor"; 2007 IEEE International Solid-State Circuits Conference. Digest of Technical Papers; Feb. 11-15, 2007. doi: 10.1109/ISSCC.2007.373462.

Matthias Eireiner et al, "In-Situ Delay Characterization and Local Supply Voltage Adjustment for Compensation of Local Parametric Variations"; IEEE Journal of Solid-State Circuits; vol. 42, Issue 7, pp. 1583-1592, Jul. 2007. doi: 10.1109/JSSC.2007.896695.

Matthew Fojtik et al, "Bubble Razor: An architecture-independent approach to timing-error detection and correction"; 2012 IEEE International Solid-State Circuits Conference; Feb. 19-23, 2012. doi: 10.1109/ISSCC.2012.6177103.

Matthew Fojtik et al, "Bubble Razor: Eliminating Timing Margins in an ARM Cortex-M3 Processor in 45 nm CMOS Using Architecturally Independent Error Detection and Correction"; IEEE Journal of Solid-State Circuits; vol. 48, Issue 1, pp. 66-81, Jan. 2013. doi: 10.1109/JSSC.2012.2220912.

Piero Franco et al, "On-Line Delay Testing of Digital Circuits"; Proceedings of IEEE VLSI Test Symposium; Apr. 25-28, 1994. doi: 10.1109/VTEST.1994.292318.

V. Huard et al, "Adaptive Wearout Management with in-situ aging monitors"; 2014 IEEE International Reliability Physics Symposium; Jun. 1-5, 2014. pp. 6B.4.1-6B.4.11, doi: 10.1109/IRPS.2014.6861106.

(56) References Cited

OTHER PUBLICATIONS

Liangzhen Lai et al, "SlackProbe: A Flexible and Efficient In Situ Timing Slack Monitoring Methodology"; IEEE Transactions on Computer-Aided Design of Integrated Circuits and Systems; vol. 33, Issue 8, pp. 1168-1179, Aug. 2014. doi: 10.1109/TCAD.2014.2323195.

M. Saliva et al, "Digital Circuits Reliability with In-Situ Monitors in 28nm Fully Depleted SOI"; 2015 Design, Automation Mar. 9-13, 2015. doi: 10.7873/DATE.2015.0238.

Martin Wirnshofer et al, "A Variation-Aware Adaptive Voltage Scaling Technique based on In-Situ Delay Monitoring"; 14th IEEE International Symposium on Design and Diagnostics of Electronic Circuits and Systems; pp. 261-266, Apr. 13-15, 2011. doi: 10.1109/DDECS.2011.5783090.

Martin Wirnshofer et al, "An Energy-Efficient Supply Voltage Scheme using In-Situ Pre-Error Detection for on-the-fly Voltage Adaptation to PVT Variations"; 2011 International Symposium on Integrated Circuits; pp. 94-97, Dec. 12-14, 2011. doi: 10.1109/ISICir.2011.6131888.

Martin Wirnshofer et al, "On-line supply voltage scaling based on in situ delay monitoring to adapt for PVTA variations"; Journal of Circuits, Systems and Computers; vol. 21, No. 08, Mar. 7, 2012. doi: 10.1142/S0218126612400270.

S. Mhira et al, "Dynamic Adaptive Voltage Scaling in Automotive environment"; 2017 IEEE International Reliability Physics Symposium (IRPS); pp. 3A-4.1-3A-4.7, Apr. 2-6, 2017. doi: 10.1109/IRPS.2017.7936279.

A. Benhassain et al, "Early failure prediction by using in-situ monitors: Implementation and application results"; Online at: https://ceur-ws.org/Vol-1566/Paper6.pdf, Mar. 18, 2016.

Charles R. Lefurgy et al, "Active Management of Timing Guardband to Save Energy in POWER7"; 2011 44th Annual IEEE/ACM International Symposium on Microarchitecture (MICRO); pp. 1-11; Dec. 3-7, 2011.

C. R. Lefurgy et al., "Active Guardband Management in Power7+ to Save Energy and Maintain Reliability"; in IEEE Micro, vol. 33, No. 4, pp. 35-45, Jul.-Aug. 2013. doi: 10.1109/MM.2013.52.

B. Zandian et al, "Cross-layer resilience using wearout aware design flow"; 2011 IEEE/IFIP 41st International Conference on Dependable Systems & Networks (DSN), pp. 279-290, Jun. 27-30, 2011. doi: 10.1109/DSN.2011.5958226.

M. Cho et al., "Postsilicon Voltage Guard-Band Reduction in a 22 nm Graphics Execution Core Using Adaptive Voltage Scaling and Dynamic Power Gating"; in IEEE Journal of Solid-State Circuits, vol. 52, No. 1, pp. 50-63, Jan. 4, 2017. doi: 10.1109/JSSC.2016.2601319.

W. Shan et al, "Timing error prediction based adaptive voltage scaling for dynamic variation tolerance"; 2014 IEEE Asia Pacific Conference on Circuits and Systems (APCCAS), pp. 739-742, Nov. 17-20, 2014. doi: 10.1109/APCCAS.2014.7032887.

J. Li et al, "Robust and in-situ self-testing technique for monitoring device aging effects in pipeline circuits"; 2014 51st ACM/EDAC/IEEE Design Automation Conference (DAC), pp. 1-6, Jun. 1-5, 2014.

X. Shang et al, "A 0.44V-1.1V 9-transistor transition-detector and half-path error detection technique for low power applications"; 2017 IEEE Asian Solid-State Circuits Conference (A-SSCC), pp. 205-208, Nov. 6-8, 2017. doi: 10.1109/ASSCC.2017.8240252.

Liangzhen Lai et al, "Accurate and inexpensive performance monitoring for variability-aware systems"; 2014 19th Asia and South Pacific Design Automation Conference (ASP-DAC), pp. 467-473, Jan. 20-23, 2014. doi: 10.1109/ASPDAC.2014.6742935.

Martin Wirnshofer et al, "Adaptive voltage scaling by in-situ delay monitoring for an image processing circuit"; 2012 IEEE 15th International Symposium on Design and Diagnostics of Electronic Circuits & Systems (DDECS), pp. 205-208, Apr. 18-20, 2012. doi: 10.1109/DDECS.2012.6219058.

Youhua Shi et al, "Suspicious timing error prediction with in-cycle clock gating"; International Symposium on Quality Electronic Design (ISQED), pp. 335-340, Mar. 4-6, 2013. doi: 10.1109/ISQED.2013.6523631.

Youhua Shi et al, "In-situ timing monitoring methods for variation-resilient designs"; 2014 IEEE Asia Pacific Conference on Circuits and Systems (APCCAS), pp. 735-738, Nov. 17-20, 2014. doi: 10.1109/APCCAS.2014.7032886.

Jongho Kim et al., "Adaptive delay monitoring for wide voltage-range operation"; 2016 Design, Automation & Test in Europe Conference & Exhibition (DATE), pp. 511-516, Mar. 14-18, 2016. DOI: 10.3850/9783981537079_0330.

Xiaobin Yuan et al., "Design Considerations for Reconfigurable Delay Circuit to Emulate System Critical Paths"; in IEEE Transactions on Very Large Scale Integration (VLSI) Systems, vol. 23, No. 11, pp. 2714-2718, Nov. 2015. doi: 10.1109/TVLSI.2014.2364785.

Kan Takeuchi et al; "FEOL/BEOL wear-out estimator using stress-to-frequency conversion of voltage/temperature-sensitive ring oscillators for 28nm automotive MCUs"; IEEE, pp. 265-268, Oct. 20, 2016. doi: 10.1109/ESSCIRC.2016.7598293.

Kan Takeuchi et al; "Wear-out stress monitor utilising temperature and voltage sensitive ring oscillators" IET Circuits, Devices & Systems. vol. 12 No. 2, pp. 182-188, Jan. 15, 2018. doi: 10.1049/iet-cds.2017.0153.

Kan Takeuchi et al; "Experimental Implementation of 8.9Kgate Stress Monitor in 28nm MCU along with Safety Software Library for IoT Device Maintenance"; IEEE International Reliability Physics Symposium (IRPS). Mar. 31, 2019. doi: 10.1109/IRPS.2019.8720583.

Dan Ernst et al; "Razor: circuit-level correction of timing errors for low-power operation," in IEEE Micro, vol. 24, No. 6, pp. 10-20, Nov.-Dec. 2004, doi: 10.1109/MM.2004.85.

Dan Ernst et al; "Razor: A Low-Power Pipeline Based on Circuit-Level Timing Speculation"; Appears in the 36th Annual International Symposium on Microarchitecture (MICRO-36). Dec. 1, 2003. San Diego, CA, USA, 2003, pp. 7-18, doi: 10.1109/MICRO.2003.1253179.

James P. Hofmeister, et al, "Ball Grid Array (BGA) Solder Joint Intermittency Detection: SJ BIST™", IEEE Aerospace Conference Proceedings, Apr. 2008, paper #1148, Version 1. doi: 10.1109/AERO.2008.4526624.

Paulheim H, Meusel R. "A decomposition of the outlier detection problem into a set of supervised learning problems", Machine Learning, Sep. 2015, vol. 100 Issue 2, pp. 509-531. DOI 10.1007/s10994-015-5507-y.

Zhang L, Marron JS, Shen H, Zhu Z., "Singular value decomposition and its visualization", Journal of Computational and Graphical Statistics, Dec. 2007, vol. 6 Issue 4, pp. 833-854. DOI: 10.1198/106186007X256080.

Shinkai, Ken-ichi et al. "Device-parameter estimation with on-chip variation sensors considering random variability."; In 16th Asia and South Pacific Design Automation Conference (ASP-DAC 2011), pp. 683-688. IEEE, Jan. 25, 2011. doi: 10.1109/ASPDAC.2011.5722274.

Weiwei Shan et al. "An improved timing error prediction monitor for wide adaptive frequency scaling"; IEICE Electronics Express, vol. 14, No. 21, pp. 1-6, Oct. 20, 2017. DOI: 10.1587/elex.14.20170808.

Agilent Technologies; "Clock Jitter Analysis with femto-second resolution"; Jan. 1, 2008.

Yousuke Miyake et al; "Temperature and voltage estimation using ring-oscillator-based monitor for field test"; IEEE 23rd Asian Test Symposium; pp. 156-161, Nov. 16, 2014. doi: 10.1109/ATS.2014.38.

Basab Datta at al.; "Analysis of A Ring Oscillator Based on Chip Thermal Sensor in 65nm Technology". Online at: https://web.archive.org/web/20140328234617/http://www-unix.ecs.umass.edu/~dkumar/lab4_658_report/lab4_report.htm; Sep. 5, 2018.

Tilman Wolf et al; "Collaborative Monitors for Embedded System Security". Jan. 1, 2006. First Workshop on Embedded System Security in conjunction with EMSOFT '06, Oct. 26, 2006, Seoul, South Korea.

(56) References Cited

OTHER PUBLICATIONS

Sandeep Kumar Samal et al; "Machine Learning Based Variation Modeling and Optimization for 3D ICs"; J. Inf. Commun. Converg. Eng. 14(4): 258-267, Dec. 2016. DOI: 10.6109/jicce.2016.14.4.258.

Yin-Nien Chen et al; "Impacts of Work Function Variation and Line-Edge Roughness on TFET and FinFET Devices and 32-Bit CLA Circuits"; J. Low Power Electron. Appl. 2015, 5, 101-115. May 21, 2015. doi:10.3390/jlpea5020101.

Yong Zhao et al; "A Genetic Algorithm Based Remaining Lifetime Prediction for a VLIW Processor Employing Path Delay and IDDX Testing"; IEEE; Apr. 12, 2016. 2016 11th International Conference on Design and Technology of Integrated Systems in Nanoscale Era (DTIS), Istanbul, Turkey, 2016, pp. 1-4, doi: 10.1109/DTIS.2016.7483805.

Vivek S Nandakumar et al, "Statistical static timing analysis flow for transistor level macros in a microprocessor"; 2010, 11th International Symposium on Quality Electronic Design (ISQED), pp. 163-170, Mar. 22, 2010. doi: 10.1109/ISQED.2010.5450412.

Jing Li et al, "Variation Estimation and Compensation Technique in Scaled Ltps TFT Circuits for Low-Power Low-Cost Applications"; IEEE Transactions on Computer-Aided Design of Integrated Circuits and Systems, vol. 28(1):46-59, Jan. 1, 2009. doi: 10.1109/TCAD.2008.2009149.

Xie Qing et al "Variation-Aware Joint Optimization of the Supply Voltage and Sleep Transistor Size for 7nm FinFET Technology"; 2014 IEEE 32nd international conference on computer design, pp. 380-385, Oct. 19, 2014. doi: 10.1109/ICCD.2014.6974709.

Rebaud B et al , "Timing slack monitoring under process and environmental variations: Application to a DSP performance optimization"; Microelectronics Journal vol. 42 Issue 5, pp. 718-732, Feb. 8, 2011. doi: 10.1016/j.mejo.2011.02.005.

Dierickx B et al, "Propagating variability from technology to system Level"; Physics of Semiconductor Devices, pp. 74-79, Dec. 16, 2007. doi: 10.1109/IWPSD.2007.4472457.

Zheng K., "A Comparison of Digital Droop Detection Techniques in ASAP7 FinFET"; Research Review. Sep. 2019.

Hongge Chen, "Novel Machine Learning Approaches for Modeling Variations in Semiconductor Manufacturing," Master thesis, Jun. 2017.

Nidhal Selmane, Shivam Bhasin, Sylvain Guilley, Tarik Graba, Jean-Luc Danger. "WDDL is Protected Against Setup Time Violation Attacks." CHES, Sep. 2009, Lausanne, Switzerland. pp. 73-83. doi: 10.1109/FDTC.2009.40.

Nidhal Selmane, Shivam Bhasin, Sylvain Guilley, Jean-Luc Danger. "Security evaluation of application-specific integrated circuits and field programmable gate arrays against setup time violation attacks." IET Inf. Secur., 2011, vol. 5, Iss. 4, pp. 181-190. doi: 10.1049/iet-ifs.2010.0238.

Jianfeng Zhang et al, "Parameter Variation Sensing and Estimation in Nanoscale Fabrics"; Journal of Parallel and Distributed Computing; vol. 74, Issue 6, pp. 2504-2511, Jun. 1, 2014. https://doi.org/10.1016/j.jpdc.2013.08.005.

I. A. K. M. Mahfuzul et al, "Variation-sensitive monitor circuits for estimation of Die-to-Die process variation"; 2011 IEEE ICMTS International Conference on Microelectronic Test Structures; pp. 153-157, Apr. 4-7, 2011. doi: 10.1109/ICMTS.2011.5976878.

Ying Qiao et al, "Variability-aware compact modeling and statistical circuit validation on SRAM test array"; Proceedings vol. 9781, Design-Process-Technology Co-optimization for Manufacturability X, Mar. 16, 2016. https://doi.org/10.1117/12.2219428.

David Herres, "The Eye Diagram: What is it and why is it used?"; Online at: https://www.testandmeasurementtips.com/basics-eye-diagrams/, Aug. 16, 2016.

Yu-Chuan Lin et al, "A 10-GB/s Eye-Opening Monitor Circuit for Receiver Equalizer Adaptations in 65-nm CMOS;" in IEEE Transactions on Very Large Scale Integration (VLSI) Systems, vol. 28, No. 1, pp. 23-34, Jan. 2020. doi: 10.1109/TVLSI.2019.2935305.

PCT International Search Report for International Application No. PCT/IL2019/050433, mailed Aug. 28, 2019, 6pp.

PCT Written Opinion for International Application No. PCT/IL2019/050433, mailed Aug. 28, 2019, 5pp.

PCT International Preliminary Report on Patentability for International Application No. PCT/IL2019/050433, issued Oct. 20, 2020, 6pp.

\* cited by examiner

INTEGRATED CIRCUIT PROFILING AND ANOMALY DETECTION

CROSS REFERENCE TO RELATED APPLICATIONS

This application is a continuation of U.S. Patent Application Ser. No. 17/047,243, filed Oct. 13, 2020, entitled "Integrated Circuit Profiling and Anomaly Detection," now U.S. Pat. No. 11,762,013, which is a National Phase Application of PCT Patent Application No. PCT/IL2019/050433, filed Apr. 16, 2019, entitled "Integrated Circuit Profiling and Anomaly Detection," which claims priority to U.S. Provisional Patent Application No. 62/657,986, filed Apr. 16, 2018, entitled "Integrated Circuit Profiling and Anomaly Detection," the contents of all of which are all incorporated herein by reference in their entirety.

FIELD OF THE INVENTION

The invention relates to the field of integrated circuits.

BACKGROUND

Integrated circuits (ICs) may include analog and digital electronic circuits on a flat semiconductor substrate, such as a silicon (Si) wafer. Microscopic transistors are printed onto the substrate using photolithography techniques to produce complex circuits of billions of transistors in a very small area, making modern electronic circuit design using ICs both low cost and high performance. ICs are produced by assembly lines of factories, termed foundries, that have commoditized the production of ICs, such as complementary metal-oxide-semiconductor (CMOS) ICs. Digital ICs contain billions of transistors arranged in functional and/or logical units on the wafer, and are packaged in a metal, plastic, glass, ceramic casing, and/or the like.

ICs are tested during production for detection of defects, such as by using wafer tests, package tests, circuit tests, end-user device operational tests, and/or the like. For example, wafer testing may determine bad ICs on each wafer tested, and the defective ICs may be discarded. For example, package/circuit/device testing may test the product operation prior to end-user use, and defective products/batches discarded. For example, marketing, warranty, and maintenance statistics may reflect on the compliance between the requirements, specs, design, and testing during the product development. Each of these types of tests may produce lists of defective products that may be analyzed to improve the design of the next generation of products, such as by reducing the number of defective parts per million (DPPM) in the manufacturing of an IC and/or end-user product.

DPPM is a common metric used to measure quality of semiconductor product production. With electronics becoming a part of everyday life (such as wearable electronics and semi-autonomous vehicles), there's an increasing drive to improve quality and prevent failures in use. For mission-critical segments, such as automotive, medical, and/or the like, customer requirements are driving improvements to the Defective Parts Per Billion (DPPB) range.

Currently, many methods are used to improve quality in the overall manufacturing test process: data feed forward, bi-variant and multi-variant analysis, quality indexing, and/or the like. Many of these methods are used to deliver products to quality and safety-sensitive market segments, such as automotive, medical, data servers, and/or the like. These methods may lower DPPM rates and may reduce the number of expensive test steps, such as burn-in and system-level tests.

Data Feed Forward (DFF) methods leverage data collected from any step in the manufacturing flow and make the data available to any other downstream test. By analyzing manufacturing data throughout the supply chain, manufacturing and quality engineers may recall data from any test, such as wafer sort, package, final circuit test, system-level test, and/or the like, for improving the DPPM. This data may be compared in real-time for the same device being tested to check for any variations in test results (i.e., anomalies) that may indicate whether the product prematurely fail during use, changes to the manufacturing should be made, and/or the like.

Bi-variant and multi-variant analyses try to find empirical relationships between two or more tests. Tests that have strong correlations may be used to identify outliers within the populations. This may improve quality for many market segments because bi-variant and multi-variant outliers may be devices that are difficult to screen out by regular test programs. These outliers may have high correlation to devices that may fail prematurely, be returned as RMAs, and/or the like.

ICs for automotive applications are specified to satisfy long-term reliability requirements and be less sensitive to electromechanical stresses. Robustness of automotive ICs may be related to individual IC products whose test parameters are well-centered in the distributions of the main parameters reported in the datasheets of the ICs. Part-average testing (PAT) may identify the ICs with more well centered parameters, i.e., strongly on spec.

PAT may be adopted by semiconductor companies to help them meet the stringent requirements of the automotive industry (such as Automotive Electronics Council: AEC-Q001-Rev D). Reliability studies have shown that semiconductor parts that have abnormal characteristics tend to be higher contributors to long-term quality and reliability problems. Devices that originally passed all manufacturing tests but may be considered "outliers" compared to other parts in the same population or lot may be more likely to fail in the field. This may be the basis for PAT, which proactively identifies outliers for exclusion from production shipments. PAT may operate by modifying the pass/fail test limits based on statistical sampling of multiple devices.

PAT may be a dynamic test. For example, in an Electrical Wafer Sort (EWS) process the testing procedure of a silicon wafer containing ICs may be performed by a mechanical probe that makes contact to the pads of each IC on the wafer. The probe card may be electrically connected through cables to the testing equipment. An automated system sequentially tests all the dies contained in the wafer. As the testing procedure proceeds, the data log file containing the measurement results may be analyzed by software to compute mean ($\mu$) and standard deviation (s). Once the distributions of parameters are known, the outlier parts that passed the test but are not in the range may be identified. For example, parts are rejected and considered out of specifications at PAT 4 sigma test, such as outside of the range of from $\mu-4*s$ to $\mu+4*s$.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in accordance with an embodiment, a computerized method for IC classification and/or outlier detection, comprising: providing a wafer comprising a plurality of ICs in accordance with an IC design, wherein the IC design comprises a plurality of sensors; and using at least one hardware processor for testing each of the plurality of ICs by: collecting a plurality of sensor values, the plurality of sensor values including sensor values from each of the plurality of sensors; and comparing the plurality of collected sensor values to a classification scheme, thereby obtaining a classification for each tested IC. In embodiments, the method further comprises recording the classification of each tested IC. In embodiments, the step of providing comprises manufacturing the wafer based on the IC design using a fabrication process.

There is provided, in accordance with an embodiment, a computerized method for semiconductor integrated circuit (IC) classification, comprising using at least one hardware processor for: receiving an IC design and data descriptive of a fabrication process. The at least one hardware processor is used for simulating a plurality of IC electronic operations based on the IC design and fabrication process to produce a plurality of simulated IC operation values and a plurality of simulated device operation values. The at least one hardware processor is used for factorizing the plurality of simulated IC operation values and the plurality of simulated device operation values to determine a subset of operational values for sensor placement. The at least one hardware processor is used for selecting some of the subset of operational values producing a sensor placement set, and for each of the selected subset, analyzing the IC design to incorporate within the IC design one of a plurality of sensors configured to the specific electronic operation, wherein each element of the sensor placement set comprises a type of sensor and a location within the IC design, wherein the sensor placement set is configured to produce a plurality of sensor values that are sensitive to the IC design and the fabrication process. The at least one hardware processor is used for classifying the IC design into operational classes based on the plurality of sensor values thereby producing a classification scheme, wherein the operational classes comprise at least one outlier class. The classes (operational, outliers, etc.) may be determined either from the pre-Si simulated data or/and from the post-Si wafer test data.

There is provided, in accordance with an embodiment, a computerized method for IC anomaly detection comprising using at least one hardware processor for manufacturing a wafer based on an IC design using a fabrication process, wherein the wafer comprises a plurality of ICs, and wherein the IC design comprises a plurality of sensors. The at least one hardware processor is used for testing each of the plurality of ICs by: collecting a plurality of sensor values, at least one of the plurality of sensor values from each of the plurality of sensors; comparing the plurality of sensor values to a classification scheme; and recording the classification of the tested IC.

There is provided, in accordance with an embodiment, a testing device for reducing the test time of each of a plurality of ICs, comprising at least one hardware processor. The hardware processor is configured for testing each of a plurality of ICs by: collecting a plurality of sensor values, at least one of the plurality of sensor values from each of a plurality of sensors incorporated into each of the plurality of ICs; comparing the plurality of sensor values to a classification scheme, thereby obtaining a classification for each tested IC; and reducing the test time for each tested IC based on the classification.

In some embodiments, the classification scheme is based on simulations of a plurality of IC operations of the IC design and the fabrication process, wherein the simulations are at least one of at least one complete IC design simulation, at least one partial IC design simulation, and at least one device simulation for the fabrication process.

In some embodiments, the classification scheme is based on a plurality of training sensor values collected during a pre-production tape-out test.

In some embodiments, the classification scheme is based on the collected plurality of sensor values.

In some embodiments, the classification scheme comprises an outlier class.

In some embodiments, the comparing comprises estimating high coverage measurements from the plurality of sensor values using at least one of a function and a rule determined from a training set of sensor values and training high coverage measurements.

In some embodiments, the factorizing comprises incorporation of post-Si wafer testing data into determining the subset.

In some embodiments, the factorizing comprises incorporation of end-customer use data into determining the subset.

In some embodiments, the selecting comprises incorporation of post-Si wafer testing data into determining the sensor placement set.

In some embodiments, the factorizing comprises incorporation of end-customer use data into determining the sensor placement set.

In some embodiments, any of the computerized methods herein disclosed further comprise using the least one hardware processor for marking an IC package of the tested IC with unique identifications based on the classification.

In some embodiments, each of the plurality of sensors is selected from the group consisting of a rising time delay sensor, a falling time delay sensor, a frequency maximum detection circuit, an IC unit total leakage current detection sensor based on a frequency conversion circuit, an IC unit voltage drain to drain leakage current detection sensor based on a frequency conversion circuit, an IC unit voltage source to drain leakage current detection sensor based on a frequency conversion circuit, an IC unit SRAM minimal voltage frequency conversion circuit, and/or the like.

In some embodiments, any of the methods herein disclosed are embodied in a computer program product.

In some embodiments, any of the methods herein disclosed are embodied in a computerized system.

In some embodiments, any of the computerized methods herein disclosed further comprise using the least one hardware processor for marking an IC package of the tested IC with unique identifications based on the classification.

In some embodiments, any of the computerized methods herein disclosed further comprise using the least one hardware processor for discarding a defective IC.

In some embodiments, the each of the plurality of sensors is selected from the group consisting of a rising time delay sensor, a falling time delay sensor, a frequency maximum detection circuit, an IC unit total leakage current detection sensor based on a frequency conversion circuit, an IC unit voltage drain to drain leakage current detection sensor based on a frequency conversion circuit, and an IC unit voltage source to drain leakage current detection sensor based on a frequency conversion circuit.

In some embodiments, the computerized method further comprises: (i) from each tested IC, determining a set of parameters of the fabrication process based on the classification and the plurality of sensor values, (ii) selecting a second set of parameters of the fabrication process based on the IC design and the sets of parameters of the fabrication process for each IC, and (iii) a second manufacturing of a second wafer using the second set of parameters, wherein the selecting is performed by at least one of a manual process and an automatic computation.

In some embodiments, the computerized method further comprises determining at least one of (i) a sensor value shift and (ii) an outlier using the classification scheme during at least one of a package testing, a circuit testing, a burn-in testing, a high-temperature operating life testing, and a final product testing.

In some embodiments, the classification comprises a hierarchical data structure for determining the classification of each die.

In some embodiments, the method further comprises: identifying the classification scheme based on a plurality of classification values by: establishing a matrix representation from the plurality of classification values, each row of the matrix representation comprising classification values in respect of one of the plurality of ICs; computing a covariance matrix from the matrix representation and a singular value decomposition (SVD) for the covariance matrix; determining, using the SVD, a plurality of distance values, each distance value representing a respective distance between one IC of the plurality of ICs and another IC of the plurality of ICs; and identifying, from the plurality of distance values, at least one family, thereby defining the classification scheme.

In some embodiments, the step of identifying, from the plurality of distance values, at least one family comprises: classifying a first IC of the plurality of ICs in a first family, such that the first family is defined by the first IC; comparing a distance value, from the plurality of distance values, representing a distance between the first IC and a second IC of the plurality of ICs with a predetermined threshold; if the distance value is less than the predetermined threshold, classifying the second IC in the first family; and if the distance value is greater than the predetermined threshold, classifying the second IC in a second family, such that the second family is defined by the second IC.

In some embodiments, the step of identifying, from the plurality of distance values, a plurality of families further comprises, for each other IC of the plurality of ICs: identifying a group of distance values, from the plurality of distance values, each distance value in the group of distance values representing a distance between the other IC and a respective IC of the plurality of ICs that defines a respective family; comparing each distance value from the group of distance values with the predetermined threshold; if a distance value from the group of distance values, representing a distance between the respective other IC and a specific IC of the plurality of ICs that defines a specific family, is less than the predetermined threshold, classifying the other IC in the specific family; and if all the distance values from the group of distance values are greater than the predetermined threshold, classifying the other IC in a new family, such that the new family is defined by the other IC.

In some embodiments, the step of computing a covariance matrix from the matrix representation comprises normalizing the matrix representation prior to computing the covariance matrix.

In some embodiments, the plurality of classification values are based on one or more of: simulated sensor values determined from a simulation of the IC design; a plurality of training sensor values collected during a pre-production tape-out test; and measured sensor values.

In some embodiments, the step of identifying the classification scheme based on the plurality of classification values is at least part of the step of comparing the plurality of collected sensor values to a classification scheme, thereby obtaining a classification for each tested IC.

In some embodiments, the plurality of classification values are based on simulated sensor values determined from a simulation of the IC design. In some embodiments, the step of identifying the classification scheme based on a plurality of classification sensor values takes place before the step of comparing the plurality of collected sensor values to a classification scheme, thereby obtaining a classification for each tested IC, the step of comparing the plurality of collected sensor values to a classification scheme comprising: establishing a collected data matrix representation from the plurality of collected sensor values, each row of the matrix representation comprising collected sensor values in respect of one of the plurality of ICs; computing a collected data covariance matrix from the collected data matrix representation and a singular value decomposition (SVD) for the collected data covariance matrix; determining, using the SVD, a plurality of collected data distance values, each distance value representing a respective distance between one IC of the plurality of ICs and another IC of the plurality of ICs; and classifying, from the plurality of distance values, each of the ICs according to the classification scheme.

In some embodiments, the step of computing a covariance matrix from the matrix representation comprises normalizing the matrix representation prior to computing the covariance matrix to define normalization coefficients thereby. In some embodiments, the step of computing a collected data covariance matrix from the collected data matrix representation comprises normalizing the matrix representation using the defined normalization coefficients prior to computing the collected data covariance matrix.

In some embodiments, the matrix representation is established from simulated sensor values determined from a simulation of the IC design and/or design signature values and/or catalog values.

In some embodiments, the step of determining, using the SVD, a plurality of distance values comprises: defining a set of Pre-Si SVD signatures by identifying vectors of the SVD for which the corresponding principal values of the SVD are greater than a pre-defined value and/or a pre-defined number of principal vectors of the SVD for which the principal values of the SVD are the greatest; and determining the plurality of distance values using the set of Pre-Si SVD signatures. In some embodiments, the step of determining the plurality of distance values using the Pre-Si SVD signatures comprises calculating at least some of the plurality of distance values, each of the at least some of the plurality of distance values being based on a distance between one of the Pre-Si SVD signatures and another of the Pre-Si SVD signatures. In some embodiments, the step of determining the plurality distance values using the set of Pre-Si SVD signatures comprises: configuring a plurality of estimators from the simulated sensor values and the set of Pre-Si SVD signatures, each estimator generating an estimated SVD signature from input sensor values; estimating from the plurality of estimators, for each of the plurality of ICs, a respective Post-Si SVD signature from the plurality of sensor values; and calculating at least some of the plurality of distance values, each of the at least some of the plurality of distance values being based on a distance between one of the Post-Si SVD signatures and another of the Post-Si SVD signatures.

In some embodiments, the step of determining the plurality distance values using the set of Pre-Si SVD signatures further comprises calculating further distance values of the plurality of distance values, each of the further distance values being based on a distance between the Pre-Si SVD signature for one IC and the Post-Si SVD signature for another IC.

In some embodiments, the method further comprises computing at least one conversion rule comprising an input data and an output data.

In addition to the exemplary aspects and embodiments described above, further aspects and embodiments will become apparent by reference to the figures and by study of the following detailed description. Moreover, the various features and embodiments of the invention described above are specifically contemplated to be used alone as well as in various combinations.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Glossary

Si-Manufacturing (Process) Space

Figure 1:
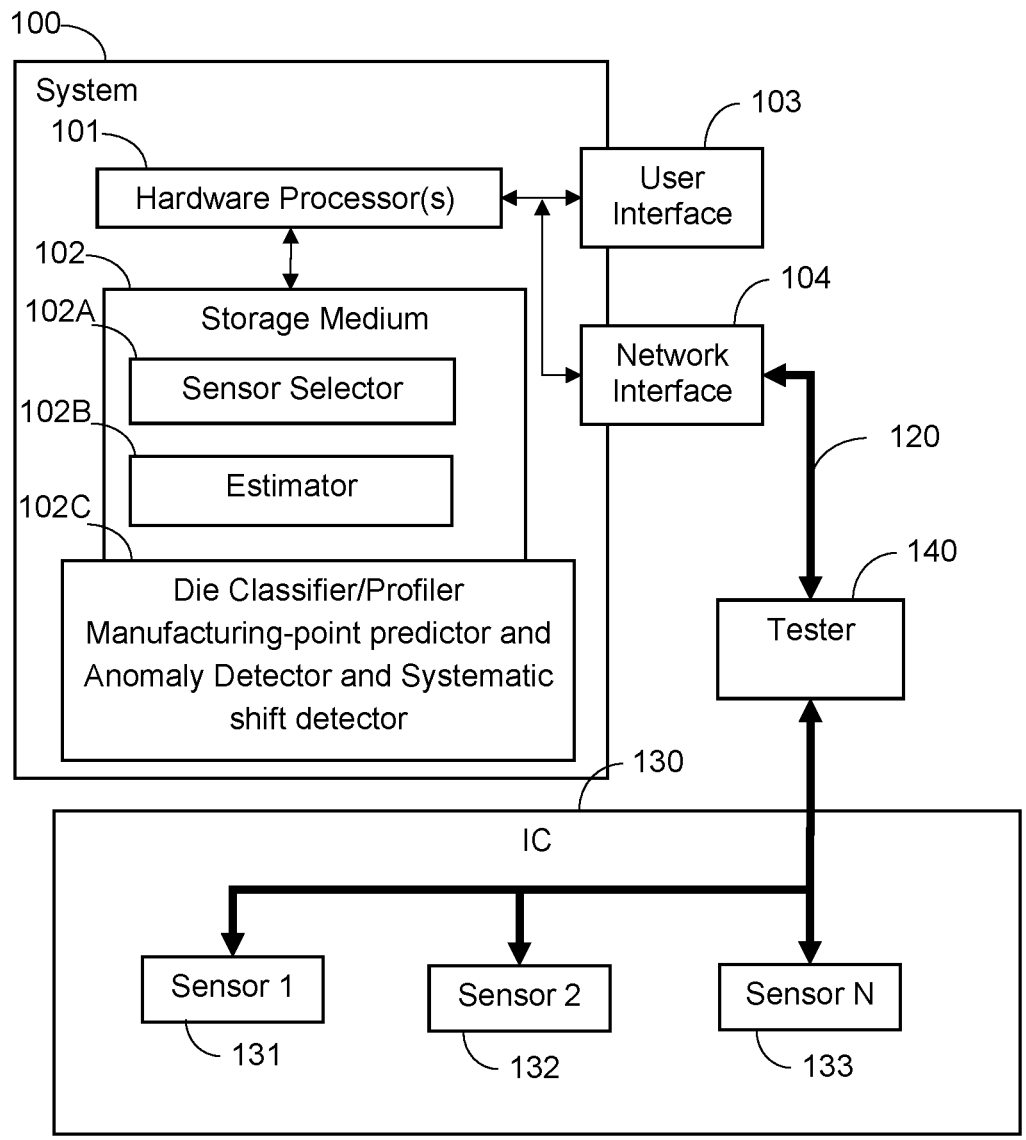
FIG. 1 shows schematically a computerized system for integrated circuit profiling and outliers detection.

Si manufacturing (process) space is the joint distribution of Si-related parameters (process parameters) over a large number of manufactured dies. The process space is the joint distribution of device-related parameters over a large number of manufactured dies, for example, the distribution of a device threshold voltage over a large number of manufactured dies. The process space affects the performance distribution of a large number of manufactured dies, for example, the joint distribution of Maximum-frequency (Fmax) and leakage current (Ioff) across many dies. As used herein, the terms process space or manufacturing space mean the set of possible manufacturing parameters (i.e., tolerances, manufacturing variability, etc.) as represented by the manufacturing of a specific die.

Device Type

A certain process-technology is characterized by the device types that are manufactured using the technology (i.e., process, fab, etc.), for example:
  SVT-type: N or P devices manufactured with standard threshold voltage,
  LVT-type: N or P devices manufactured with low threshold voltage, and
  ULVT-type: N or P devices manufactured with ultra-low threshold voltage.

Pre-Si Data (or Pre-Silicon Data)

Data that is generated by simulating a certain IC design manufactured by a certain process, such as by Monte-Carlo simulations.

Post-Si Data (or Post-Silicon Data)

Data that is measured from manufactured dies, such as data recorded during wafer testing.

Signature

Sets of values or expected distributions used in determining manufactured IC performance (class, outlier, etc.), such as IC-design simulated parameter superset, tested die sensor values, and/or the like. Most uses of the word signature herein may be replaced with the word data.

Agent (Sensor)

A Sensor/Agent is an electrical circuit, implemented on the die, that is used to sense or measure a certain device parameter, a sub-circuit parameter, a die-level parameter, and/or the like. For example, a sensor measures the delay of a certain logic cell.

IC Design Simulation Values

IC design operational parameters are simulated electronic parameters (i.e., voltage, current, delay, etc.) of a specific IC design with a specific simulated manufacturing process, such as the electrical parameters of an IC design over the process space. This may be a finite set, such as a large number, of possible parameters that may be measured, such as the set of all possible parameters at circuit locations that may be candidates for placing a sensor (agent).

The IC design is determined by the device-types, device-sizes, device occurrence, device locations, devices connectivity, and/or the like, that are used in the specific logic units (cells) of the IC design. The parameters may be simulated over the manufacturing space by performing Monte-Carlo (MC) simulations. For example, distributions of parameter values are simulated for the average leakage current of a specific unit within the IC design. The IC design parameters are used as an input for the singular value decomposition (SVD) computation.

Device-Process Simulated Values

Device-process parameters are sets of simulated device operational parameters, such as a catalog of device operational parameters, for individual (single) devices in a specific process, such as transistors, FETs, diodes, and/or the like. The device parameters are simulated over the manufacturing space by performing Monte-Carlo (MC) simulations. For example, the catalog includes MC data of the saturation current of a certain device (IDSAT). The device-process parameter catalog is used as an input for the SVD computation.

Inter-Connect Simulated Values

Inter-Connect simulated values are a set of simulated delay-parameters values of Inter-Connect networks. For example, the delay of Resistor-Capacitor (RC) networks connecting devices. The delay value of the RC networks is extracted over the manufacturing space by performing Inter-Connect extraction methods followed by a circuit simulation.

Classification/Profiling

Classification or profiling is the process of binning dies into Si-profiles, where each bin (profile) comprises a cluster of IC-design parameters and resulting device-level-parameters, such as high coverage parameters. During Pre-Si, the IC-design parameters and device-process parameters may be used as an input for the profiling process. During Post-Si, the sensor values and/or certain high coverage measurements may be used as input for the profiling process.

IC Profile

A specific cluster of signatures (data) values and distributions that may apply to field performance (specs, defects, etc.) For example, a specific cluster of the manufacture-space (data) values and distributions that may apply to field performance (specs, defects, etc.).

Family (of Dies)

A group of physical dies with the same Si-profile/classification. In addition, a family is a group of MC samples, for which the simulated IC Design Simulation Values and the Device-Process Simulated Values have the same Si-profile/classification as those of the physical family members.

Singular Value Decomposition (SVD)

The SVD of a matrix $\sigma$ is a set of three matrixes U, D and V such that $\Sigma = UDV^T$ where U and V denote orthogonal matrix of the left and right principal vectors of $\Sigma$, and D denotes a diagonal matrix with diagonal elements known as the singular values of $\Sigma$. For the profiling implementation, $\Sigma$ denotes a covariance matrix and therefor U=V. The singular value corresponds to a principal vector may be the variance at the vector direction.

The inputs to the SVD computation are the IC-design simulation values and device-process simulation values, and the output is a subset (i.e., such as a Device-Reduced-Representation, DRR) of the IC-design parameters that attempt to provide the most information efficiently, such as with the least number of parameters, least number of sensors, least value of sensor Silicon area, least value of total sensor power, and/or the like. The subset (i.e., DRR) may be used for finding the most informative potential locations of the sensor agent placements in the IC design, and thus the resulting sensor values may be used to gain maximum information on a specific die being tested. The final sensor placements may be determined from this subset and implemented in tape out tests during the manufacturing ramp up to best classify the dies and detect manufacturing outliers. The output subset may be chosen to be significantly smaller than the complete set of inputs and estimated using a predefined set of sensors to reduce the computation cost needed during testing of physical dies.

In addition, unsupervised learning/clustering methods, such as Self-Organized Map (SOM), can be used directly with the sensors data as their input to classifies dies into families and profiles.

High-Coverage Measurements (HCMs)

A high-coverage measurement is a Post-Si die-level measurement that characterizes a certain die, for example, the total leakage current of a certain die measured during IDDQ testing, or a large-scale timing-margin measurement of the IC logic paths during functional testing using the circuit.

The HCM and sensor values may be analyzed to correlate between them directly. For example, a set of measured sensor values predicts (estimates) the HCM, such as without profiling the dies as described above using MC simulations. The predicted HCM may be estimated with a function, such as a function determined using Machine-Learning (ML) algorithms, modeling techniques, and/or the like.

Estimator—Parameter Relationship Functions and/or Conversion Rules (also Protean Estimators)

An estimator is a function and/or rule that converts between values (i.e., defines the relationships between the die operational values analytically, empirically, heuristically, etc.), such as using sensor values as input arguments to determine a profile (profile classifier), predicted HCM values (HCM conversion function), predict subset (DRR) values, predict manufacturing point, and/or the like. As used herein, the term manufacturing point means the set of parameters that determine the manufacturing of the IC design. Similar relationships may be found between HCM values and sensor values. The results of the die testing and Protean analysis may better determine the specific dies that may operationally meet or exceed the engineering specifications.

Outlier (Manufacturing Anomaly)

An outlier is a die whose measured HCM and/or like does not match the value range expected from the die's profile, such as expected from the distribution of the values from measurements of a group of ICs of the same profile (i.e., mean plus or minus a multiple number of standard deviations).

Alternatively, an outlier may be a die whose measured HCM and/or like does not match a predicted HCM and/or like value that was calculated by the estimator function. These outliers represent dies manufactured with defects, manufacturing anomalies, and/or the like, that do not belong to the simulated profiles.

DESCRIPTION OF EMBODIMENTS

Described herein are devices, systems, and methods, for die classification (profiling) and/or outlier detection and/or manufacturing point binning/estimation. These processes may benefit integrated circuit manufacturing (IC) and testing, such as to improve wafer testing, and thereby producing fewer defects in the end-user product due to IC failure (i.e., performance or operational outlier detection).

A hardware processor and/or like executes instructions to analyze an IC design and incorporates multiple sensor agents based on the IC design. The IC design with sensors may be simulated Pre-Si or measured Post-Si to determine the sensor output values for specific designs, fabrication processes, random defects, manufacturing point estimation and/or the like.

The distributions of the sensors values may be reflected in the high-coverage measurements values, such as providing a correlation between them. The distribution of the measured values may not match the estimated distribution value from the simulations and may change in time or between IC testing systems, or between IC operational systems and thus indicate a potential manufacturing/performance/environmental and/or the like type of long term value shift, differences between IC testing systems and/or sets of hardware and/or like.

The sensor agents may be iteratively repositioned within the IC design to increase the sensitivity to outliers and/or increase the numerical separation of sensor values between families of (i.e., performance and/or operationally) similar ICs and/or to increase the sensitivity of the sensor values to the manufacturing point. These numerical value distributions may be clustered to form combinations of different ranges of sensor values used to identify the classes/families. Rule-based and/or analytical functions may describe the relationship between the sensor values, Manufacturing point (Process-Binnig), HCM values, and IC families, so given one of the data sets, the others may be determined, at least in part, such as by probabilities.

The sensor agents may be distinct circuits incorporated to the IC design that measure IC operational parameters of unites, sub-units, cells, sub-cells, devices, of the IC design, such as digital delay timing, rising edge delay, falling edge delay, device-leakage current, and/or the like.

Once the IC products with the incorporated sensor agents are manufactured, such as during tape-out cycles, preproduction, production, of the like, the sensor values are collected for each IC during wafer testing (i.e., to compute classes and/or outliers). ICs (i.e., dies) that are determined to have sensor and/or HCM values that are not within the constraints of the relationship rules/functions (i.e., estimators), may be discarded as defective, packaged for less critical applications (re-classified), separated into classes of products (such as meeting certain industry specifications), and/or the like. Dies incorporating manufacturing outliers/anomalies may be determined using multivariate analysis, outlier algorithms, and/or the like.

The data used for the relationship computations may be the results of at least two of the simulated IC design superset data, the device-process simulation data, the simulated sensor value data, the SVD results subset (DRR's, e.g., determined by the principal components, etc.), the SVD results with heuristic rules subset, the simulated HCM data, measured HCM data, the measured sensor values (i.e., during testing), operational data (i.e., defect analysis, on-specification determination, etc.), operational conditions i.e., voltage/temperature and/or the like. These relationships, and the techniques for their computation/adjustment, solve the problem in IC manufacturing of lowering defect count, increasing production yield, estimating manufacturing point, and/or the like. For example, the simulation data is used to classify the IC design-process combinations into profiles, such as predicted operational profiles based on simulated data. The profiles may be used to mark the ICs and detect outliers, thereby reducing defects and improving reliability.

Optionally, an improved yield is determined from the detection of systematic shifts in sensor values over time (i.e., manufacturing volume, etc.) For example, manufacturing equipment drift issues, correction of process point for shift detected downstream, and/or the like, may be detected by comparing the sensor values at wafer testing, package testing, circuit testing, device testing, end-of-life testing, and/or the like. For example, the shift data detected over time may be used to adjust the manufacturing process parameters (i.e., process point) so that yield is matched toward sales demand of different profiles of the same IC.

Optionally, a hierarchal data structure is used for classification to produce hierarchal classes. For example, a hierarchy of profiles is determined during wafer testing, such as when some classes in a sub-hierarchy may inherent parameters, specification, performance metrics, physical metrics, operational metrics, and/or the like.

Optionally, the testing data is used to determine profiles. For example, relationships between tested sensor values may determine that the IC is defective and not all tests need to be performed, thereby saving testing costs. Optionally, testing data and simulation data are used to determine profiles. Optionally, operational defect data is used to determine relationships, such as data acquired from analysis of post-sale customer use, defect logging, defect analysis, and/or the like. Optionally, estimated manufacturing point may be used for a further tuning/adjusting of the manufacturing process for increasing yield, improving ICs performance and/or the like.

Figure 2:
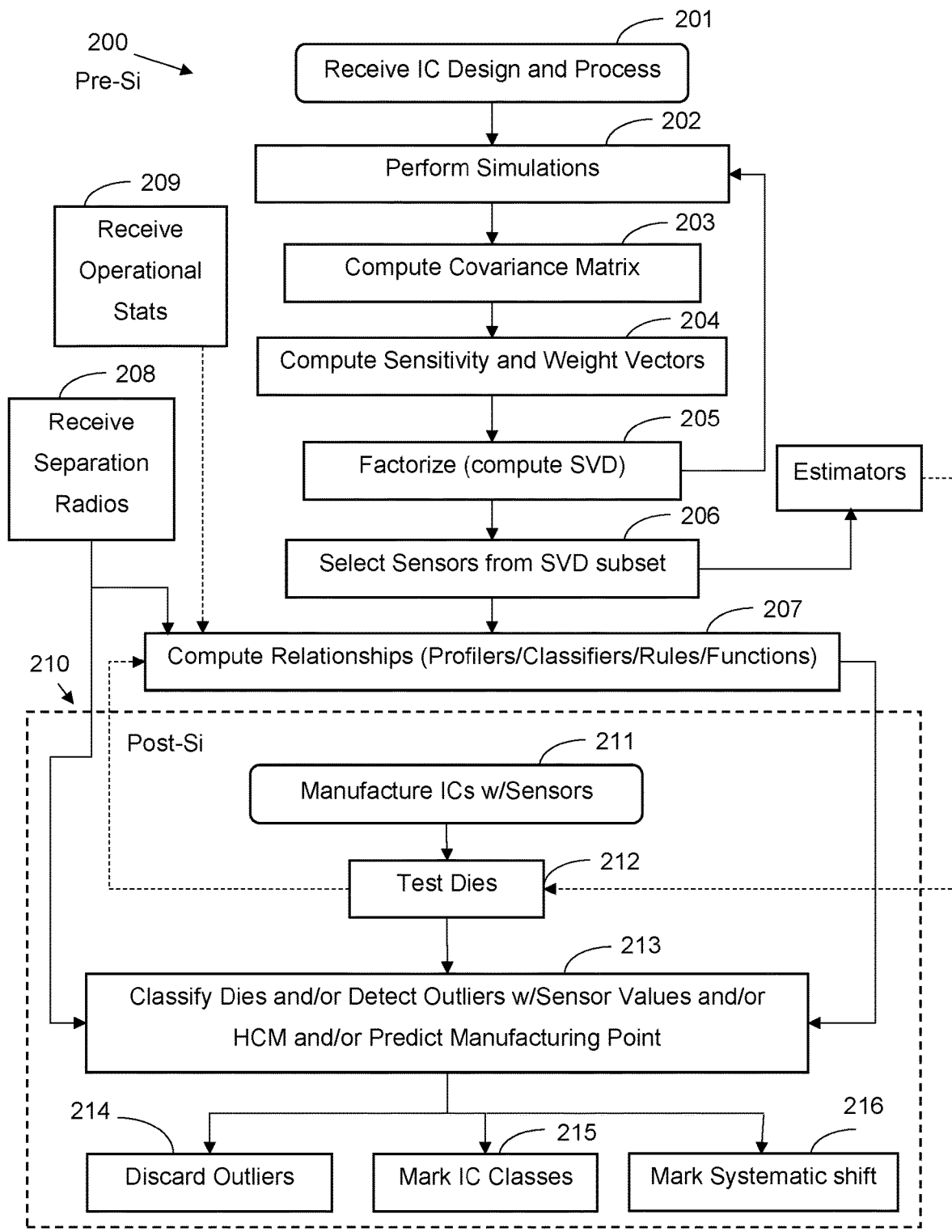
FIG. 2 shows flowcharts of methods for integrated circuit profiling and anomaly detection.

Reference is now made to FIGS. 1 and 2, which show (respectively) a schematic of a computerized system 100 and flowcharts 200 and 210 of methods (Pre-Si 200 and Post-Si 210, respectively) for integrated circuit profiling, manufacturing-point prediction, and outliers detection. System 100 comprises one or more hardware processors 101, a non-transitory computer-readable storage medium 102, a user interface 103, and a network interface 104. Storage medium 102 has encoded thereon program code, comprising processor instructions to execute on hardware processor(s) 101, thereby causing hardware processor(s) 101 to perform actions. As such, the program code is said to be configured to perform actions, though it is understood that the program code processor instructions are configured to perform the actions when executed on hardware processor(s) 101, and the actions are performed by hardware processor(s) 101. It may also be understood that the configuration of the program code is a specific arrangement of processor instructions that cause hardware processor(s) 101 to operate in a non-conventional manner, such as by execution of the unique program code.

The program code comprises a Sensor Selector 102A that is configured to receive 201 an IC design and a target process for manufacturing the ICs, and based on the IC design and target process, is configured to perform 202 simulations on the IC design to determine the distribution of operational values (IC Design Simulation Values and Inter-Connect simulation values i.e., simulation superset), and also simulate the individual electronic component operational values over the manufacturing process space (Device-process Simulation Values—i.e., Catalog). For example, Sensor Selector 102A is configured to perform 202 Monte-Carlo (MC) simulations to simulate individual ICs characteristic, IC signature generation, produce resulting sensor values (i.e., agents value), and/or the like. Sensor Selector 102A is configured to compute 203 a covariance matrix of the data for use in the factorization 205.

Sensor Selector 102A is configured to compute 204 sensitivity/weight vectors and is configured to factorize 205 (i.e., perform SVD on) the simulated values (IC design and device-process) the simulations to produce singular-value decompositions (SVDs), and a resulting subset of potential sensor locations. The SVD factorization results allow enhancing the sensitivity of the signatures to the individual IC's characteristics and design signatures and may be used to iteratively select the sensors and further increase the sensitivity of the signatures. Sensor location and type selection 206 within the IC design may be done based on SVD subset, such as the top-k principal components (i.e., top k components that explain 95% of the variance), etc.

The program code comprises a Profiler/Estimator 102B that receives 208 separation ratios and the signature SVDs, selects 206 sensor locations from the SVD subset based on the separation ratios to produce relationships between the IC classes, the HCM parameters and the sensor values. The program code is also configured to compute the Estimators block (FIG. 2). This block produce estimators, such as relationship rules, functions, and/or the like, that are used to compute the SVD-subset values by the sensors readout during the post/Si stage. The program code is configured to compute 207 relationships between measured (i.e., from testing) and simulated (i.e., pre-Si) parameters (i.e., estimators/rules/profilers/classifiers etc.) that receive an individual IC's SVD-subsets and determine the class (i.e., category/family/profile) of performance for that IC based on the signatures and classifiers. Profiler/Estimator 102B may also be configured to receive 209 operational statistics, such as defect statistics, defect engineering analyses, and/or the like, and these used to align the simulated and measured classes with the performance of the IC product in the field. As discussed below, the Pre-Si stage may be optional in embodiments, although features of this stage may be implemented with reference to a Post-Si stage.

In the Post-Si stage, ICs 130 with incorporated sensors (as at 131, 132, 133, and/or the like) are manufactured 211 (i.e., post-Si flowchart 210). A Die Classifier/Profiler Manufacturing-point predictor and Anomaly Detector and Systematic shift detector 102C (i.e., part of the program code) is configured to test 212 each die (i.e., IC) of a wafer (or receive the tests results for each IC from a tester 140 through network interface 104 and a network 120). Die Classifier/Profiler Manufacturing-point predictor and Anomaly Detector and Systematic shift detector 102C is configured to use the relationships with the data received from the IC test to determine 213 IC profiles (from the simulations and classification), manufacturing outliers (i.e., anomalies) and manufacturing point. For example, Die Classifier/Profiler Manufacturing-point predictor and Anomaly Detector and Systematic shift detector 102C is configured classify 213 each IC according to the tested sensor values, determine that an IC is a manufacturing outlier, and/or the like. One approach for classifying dies may use the steps 203-207 from the Pre-Si flowchart 200, but with reference to Post-Si data (as will be discussed below). In embodiments, die Classifier/Profiler Manufacturing-point predictor and Anomaly Detector and Systematic shift detector 102C receives the high coverage measures and the Pre-Si estimators to detect 213 when the IC may be an outlier of the classification scheme. Outliers may be discarded 214, and the classification may be used to mark 215 the IC classes on the IC (such as track the IC class according to the location on the wafer), IC packaging (such as a different grade of IC according to the class, and/or the like. The Systematic shift may marked 216 on ICs, used for planning new ICs, improving yield to ICs, used for recalibrating manufacturing parameters, and/or the like. The estimated manufactured point may be used for tuning/adjusting of the dies manufacturing process for increasing yield, improving IC's performance, and/or the like.

Figure 10A:
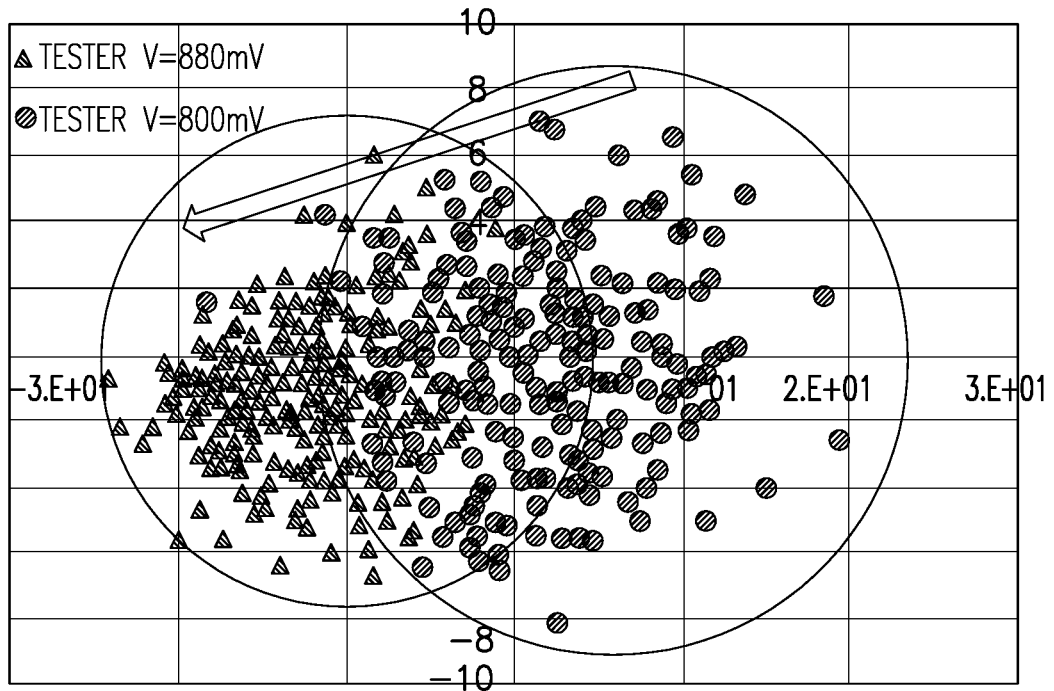
FIG. 10A shows a first systematic-shift detection.
Figure 10B:
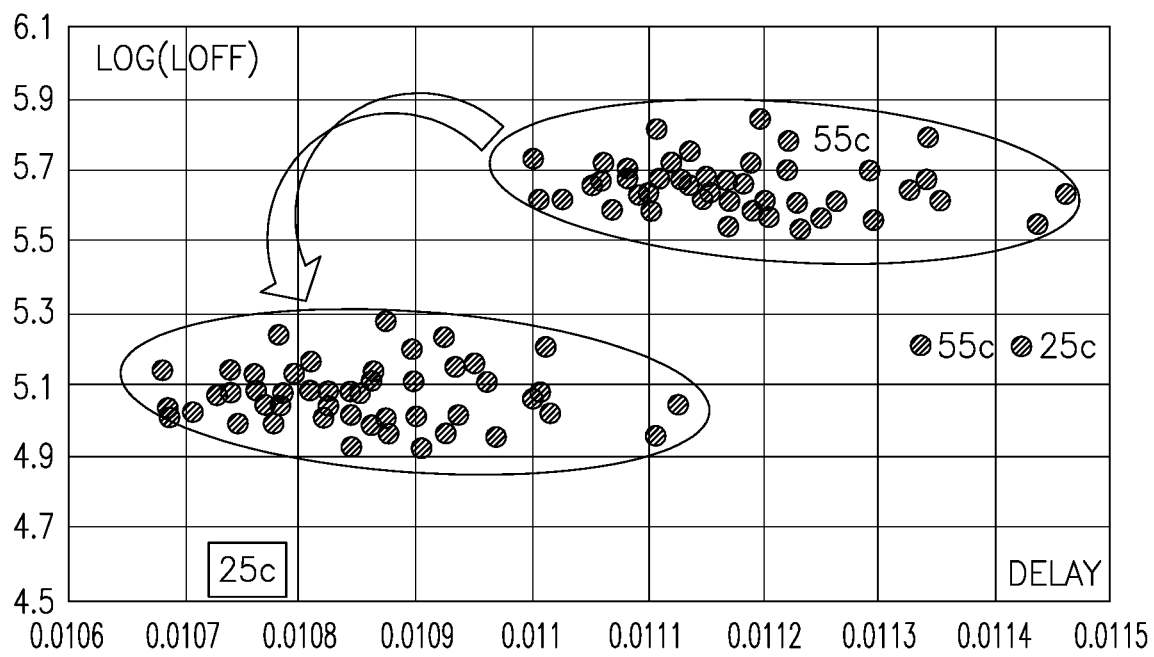
FIG. 10B shows a second systematic-shift detection.

The use of IC profiling and IC signatures may allow increasing the quantity and quality of parameters used for the multivariate analysis in determining IC classes and outliers. Since classes (i.e., family's) are not environment dependent (i.e., invariant across voltage and temperature), dies from the same classification should behave the same way at different die environments like SORT, Final-test, and system. When the behavior of a certain die is different between environments it may indicates a problem in the environment. Reference is now made to FIG. 10A and FIG. 10B, which demonstrate a detection of a systematic shift within and between environments. FIG. 10A demonstrates a detection of a pre-profiling systematic shift, i.e., a detection of a parameter shifts at the wafer-SORT testing conditions. FIG. 10B demonstrates a detection of a post-profiling systematic shift i.e., change in the environmental conditions that split a family into two groups before and after the change in conditions. As the sensors are placed within an IC design for lowering DPPM, the sensor values later used during the IC testing, device testing, failure analysis, and/or the like may better differentiate between categories/families/profiles of ICs and thus allow classification based on performance, outlier detection during testing, process binning, manufacturing point estimation, and/or the like.

Following are the details of the sensors and how the sensors are incorporated in the IC design for IC profiling, outlier detection and manufacturing point estimating.

Post-Si IC profiling may be considered the classification of individual ICs to one of multiple Si characteristic range i.e., process parameter range mapped into device electrical parameters range. The profiling may be performed by collecting from an IC a number of sensor values converted to SVD-signatures and comparing the SVD-signatures to the range of SVD-signatures assigned to a specific profile, such as by a classification method. Alternatively, the profiling may be performed directly by comparing the sensors values to ranges assigned to specific profiles, without classification based on Pre-Si simulations.

The SVD-signatures are generated Pre-Si based on device characteristics and unique Design-related signatures that are based on individual cells within the IC and the connectivity between cells within the IC. A set of device parameters characteristics is defined as the device parameters CATALOG. The Design-related signature generation may be an automatic process that may be simulated with electronic design analysis (EDA) and dynamic-timing analysis simulation tools, MC tools and circuit simulation tools.

Design related signatures may be clustered to reflect significant performance differences of a given IC design manufactured by a specific fab, etc. The clustering, classification, selection of sensors, selection of sensor locations, and/or the like, may be based on empirical or a-priori knowledge of the process (i.e., fab) and circuit design expected behavior. For example, design related signatures include values that estimate (for a variety of voltages and temperatures):

Leakage VS S,
Leakage VDD,
Total leakage
Average delay fall,
Average delay rise,
Total cells delay
Total Inter-Connect delay (RC-delay)
Fmax
Timing margin
SRAM minimal voltage per SRAM type
Chip VDD-min per all SRAM types & Register-Files and State-Elements types
and/or the like.

Figure 3A:
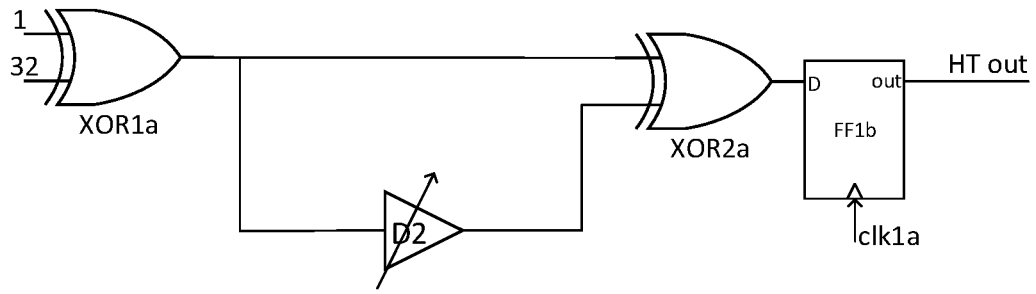
FIG. 3A shows schematically a first circuit for IC unit high-coverage timing-margin detection.
Figure 3B:
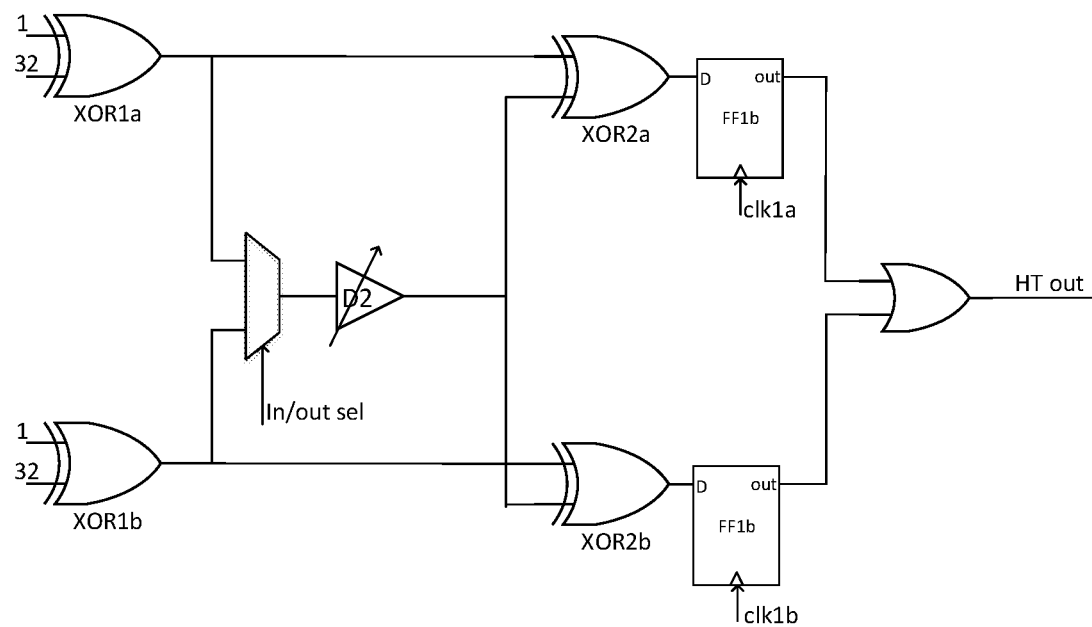
FIG. 3B shows schematically a second circuit for IC unit high-coverage timing-margin detection.

Reference is now made to FIG. 3A and FIG. 3B, which show circuits for IC unit timing margin detection. These circuits are an enhancement of the circuits described in U.S. Provisional Patent Application No. 62/586,423, filed Dec. 5, 2017, and titled "INTEGRATED CIRCUIT FAILURE PREDICTION DEVICE", incorporated herein by reference in its entirety.

Following are examples of Pre-Si signature generation algorithm, and sensor value computation/derivations. As used herein, the terms sensor value, sensor agent, sets of sensor values, signatures, and/or the like are used interchangeably to mean the sets of sensor values (i.e., data) from an IC used for the techniques disclosed herein.

A generic Pre-Si design related signature generation process may be defined as follows:
  Step 1: Define a represented vector of measurements M
  Step 2: Run MC-simulation to extract the measurement M joint-statistics behavior A generic Pre-Si Device-related parameter signature generation process may be defined as follows:
  Step 1: Define a vector of process parameters P
  Step 2: Run MC-simulation to extract the parameters P joint-statistics behavior, joint-statistic with the measurements M behavior, and\or the like.

For example, to use an Fmax signature of a specific IC design, the process may be:
  Step 1: Define Fmax measurement as the maximum operation frequency of the IC design. Fmax may be determined by Critical-Paths (CPs) of the IC, i.e., paths that comprise a limiting delay thus limiting the maximum frequency
  Step 2: Find the CP in the specific IC design for each of multiple manufacturing process values (i.e., fab parameter ranges). For example, determine a set of CPs that limit the frequency throughout the entire manufacturing ranges.

The Fmax signature manifests itself as the Minimal Margin per Unit (MMU) signature. The MMU signature measures the minimal margin per unit of the IC per MC point. Namely, the MMU apply the Fmax signature per unit. At post-Si the MMU signature may be measured by the circuits shown in FIG. 3A & FIG. 3B, given a certain configuration of the IC inputs.

For example, the total leakage signature of a specific IC design may be generated as follows:
  Step 1: Define total leakage measurement as the sum of all cell's leakage:

$$\text{Total leakage} \mid PVT = \sum_{\text{all cells}} I_{\text{off}}(i) \mid PVT$$

Step 2: Extract each cell's leakage current at each process point in the manufacturing range using Monte-Carlo (MC) simulations.

For example, the total cells delay signature of a specific IC design may be generated as follows:
  Step 1: Define Total cell-delay measurement as the sum of all cells delay:

$$\text{Total cells delay} \mid PVT = \sum_{\text{all cells}} D(i) \mid PVT$$

Step 2: The cell delay at each process point is computed using Monte-Carlo (MC) simulations For example, the total inter-connect (RC) delay signature of a specific IC design may be generated as follows:
  Step 1: Define total RC-delay measurement as the sum of all RC delays:

$$\text{Total RC delay} \mid PVT = \sum_{\text{all RC's}} RC(i) \mid PVT$$

Step 2: Extract an RC delay at each process point using Monte-Carlo (MC) simulations and different RC models.

The delay signature may be generated to represent individual rise and fall transitions with all VT's, per VT type, and/or the like. For example, delay signatures may be computed using the following equations.

$$DS_{unit} = \sum_i \text{arc}(i) \times Df(i) \times \frac{\text{\# of arc}(i)}{\text{\# total arcs (all } VT's/\text{per } VT)}$$

$$DS_{rise} = \sum_i \text{arc}_{rise}(i) \times Df(i) \times \frac{\text{\# of arc}_{rise}(i)}{\text{\# total arcs}_{rise}(\text{all } VT's/\text{per } VT)}$$

$$DS_{fall} = \sum_i \text{arc}_{fall}(i) \times Df(i) \times \frac{\text{\# of arc}_{fall}(i)}{\text{\# total arcs}_{fall}(\text{all } VT's/\text{per } VT)}$$

For example, the minimal voltage is based on the SRAM operation of a specific IC design to be generated as follows:
  Step 1: Define the minimal required voltage as the minimal voltage required by all SRAM cells:

$$\text{minimal required voltage} \mid PVT = \min_{\text{all SRAM cells}} (V(i) \mid PVT)$$

Step 2: The minimal voltage required at each process point is computed using Monte-Carlo (MC) simulations.

Following are examples of sensor circuits.
1. A Delay sensor may sense the delay of a certain logic cell. It may be implemented by a Ring-oscillator circuit that its frequency reflects the average delay of the logic cells.
2. Another delay-sensor may sense the delay of the rising-edge of a certain logic cell and the falling-edge of a logic cell in a separate way.
3. Another delay sensor may sense the RC-delay per-metal or per a subset of metals and or like.
4. A leakage-sensor may be used to sense the leakage of a certain P-device and a certain N-device in separate ways, as described in US provisional application no. 62/614,706 Entitled "INTEGRATED CIRCUIT SUB-THRESHOLD LEAKAGE SENSOR", incorporated herein by reference in its entirety.

The contribution factor of each Vth-type may be computed for each signature. The contribution factor reflects the contribution of each Vth-type to the leakage or to the average delay signatures and or/like. The contribution factors may be generated as part of the signature generation process or computed by linear regression. The vector of contributing factors for each process parameter may be considered, where the maximum over the data may be referred as the sensitivity vector and denoted by $\overline{w}$.

Let $P^{complete}$ denote the set of process parameters obtained from the device parameter catalog. Let P denote a subset of $P^{complete}$ which is obtained after selecting parameters from $P^{complete}$ for which the values in the sensitivity vector are above a given threshold. Let S denote the set of signatures at each of the operation points (M signature-operation point samples). Namely, $s_1$ is the MC samples of a given signature at a given operation point (V, T).

For each $s_j \in S$ let $\hat{s}_j = s_j | \{P \cup \{\hat{s}_i\}_{i<j}\}$, namely,
$\hat{s}_1$ denotes the part missing in the catalog for a fully estimation of the first signature at the first operation point—$s_j | P$ is the estimator of $s_1$ given P, and
$\hat{s}_j$ denotes the part missing in the catalog and all the $\hat{s}$'s added to it, for a fully estimation of the j-th signature-operation point—$s_j | P \cup \{\hat{s}_i\}_{i<j}$ is the estimator of $s_j$ given $P \cup \{\hat{s}_j\}_{i<j}$.

Then, the returned set of vectors is $P \cup \{\hat{s}_j\}_{1 \leq j \leq M}$.

The SVD of a matrix σ is a set of three matrixes U, D and V such that $\Sigma = UDV^T$ where U and V denote orthogonal matrix of the left and right principal vectors of Σ, and D denotes a diagonal matrix with diagonal elements known as the singular values of Σ. For the profiling implementation, Σ denotes a covariance matrix and therefor U=V. The singular value corresponds to a principal vector may be the variance at the vector direction.

Implementing SVD for profiling in steps:
Normalize any column that is not normal distributed, for example, apply log on values obtained from log-normal distribution
Scale the columns of table 1: μ=0, σ=1
In case that a subset P has not been taken from $P^{complete}$ with respect to the sensitivity vector. Rescale the columns with the weights vector $\overline{w}$
Produce the covariance matrix Σ from Table 1
Produce the SVD signatures by performing SVD operation on Σ, note that the set $\{\hat{s}_j\}_{1 \leq j \leq M}$ can be used instead or in additional to $\{s_j\}_{1 \leq j \leq M}$
$p_1^n$: value of parameter n, at MC run 1
$s_1^m$: value of signature at operation point m, at MC run 1

TABLE 1

| MC run | Process parameters | | Signatures (at operation point) | |
|---|---|---|---|---|
| 1 | $p_1^1$ | $p_n^1$ | $s_1^1$ | $s_m^1$ |
| ... | ... | ... | ... | ... |
| 500 | $p_1^{500}$ | $p_n^{500}$ | $s_1^{500}$ | $s_m^{500}$ |

To have a robust classification with defined error an appropriate number of families may be essential. To reduce the number of families that may form, a reduced dimensional data domain should be considered, for example, an IC design that may be sensitive to 2 Vth-types may be spread by 8 process parameters (dimensions) before reduction→ (applying SVD); {VT,IDS}×{p,n}×{SVT,LVT}. To find the reduced dimensional data domains, the orthogonal basis of the matrix Σ may be extracted. Each direction of the orthogonal basis may be a linear combination of the process parameters. The SVD also provides metrics of each of the principal directions.

For example, the following steps may determine the profiling of an IC design and a process using the sensor agents:

Profiling step (1):
Define the distance between 2 samples (i,j) as the weighted q-norm distance Δ(i, j) computed with the given # of SVD signature (input)

$$\Delta(i,j) = (\Sigma_k w_k |SVD_i^k - SVD_j^k|^q)^{1/q}$$

where SVD denotes the value of the k-th SVD signature of the sample i. For q=2 and 1's as weights the above is the Euclidean norm.

Note that the weighted q-norm can be generalized by considering multiple sets of weights (for example, the values of the principal vector) and a procedure for choosing which member of the set should be chosen (for example, the one for which the distance is maximal)-$\Delta_L(i, j)$=max(abs(($\overline{SVD}_i - \overline{SVD}_j)U^{-1}$)) Note that Mahalanobis distance $\Delta(i, j) = \sqrt{(\overline{SVD}_i - \overline{SVD}_j)\Sigma(\overline{SVD}_i - \overline{SVD}_j)^T}$ may be used instead or in additional of performing the SVD procedure, where $\overline{SVD}_i$ is a vector consisting of the SVD signatures of sample i and U is the principal vectors matrix.

Profiling step (2):
Define the families: the distance between a sample to a certain family is the distance to the sample that defines the family
1. Define the first sample as a family
2. Go over all the samples and when the distance Δ of the current sample to all the defined families is larger than the given radius then defines a new family
Associate samples to the closest family (correction process)
1. Go over all the samples and associate the sample to the family to which the distance is minimal The above procedure may be performed on a batch of samples, for example on a set of MC samples or a group of dies with known test results (for example, in case that the tester is offline), or performed online, for example when the tester is online.

Figure 4:
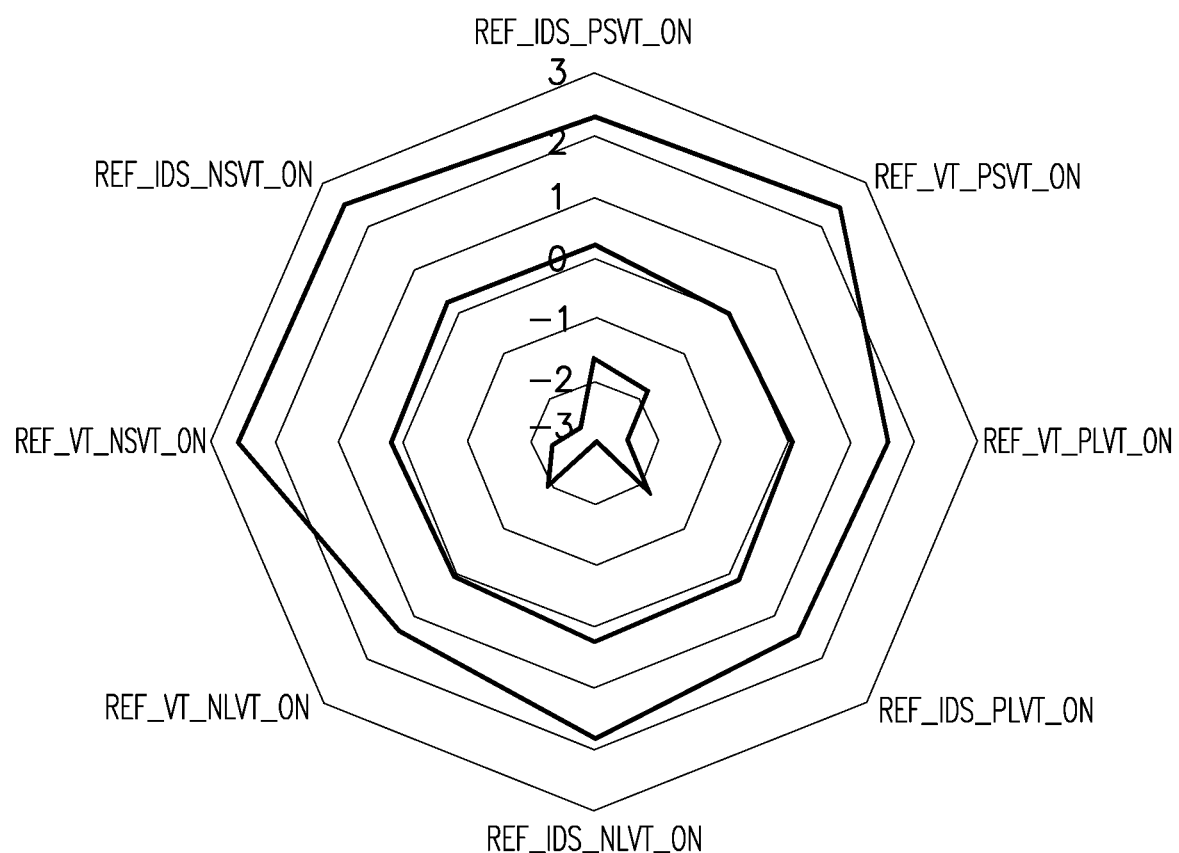
FIG. 4 shows a radar (spider) plot of IC profiles.

FIG. 4 show the profiling results, families are defined by the median of device parameters per device types {VT, IDS}×{p,n}×{SVT,LVT}. Each vertex of the polygon represents a normalized device parameter value (in sigma terms) with respect to its typical/center value.

Figure 5:
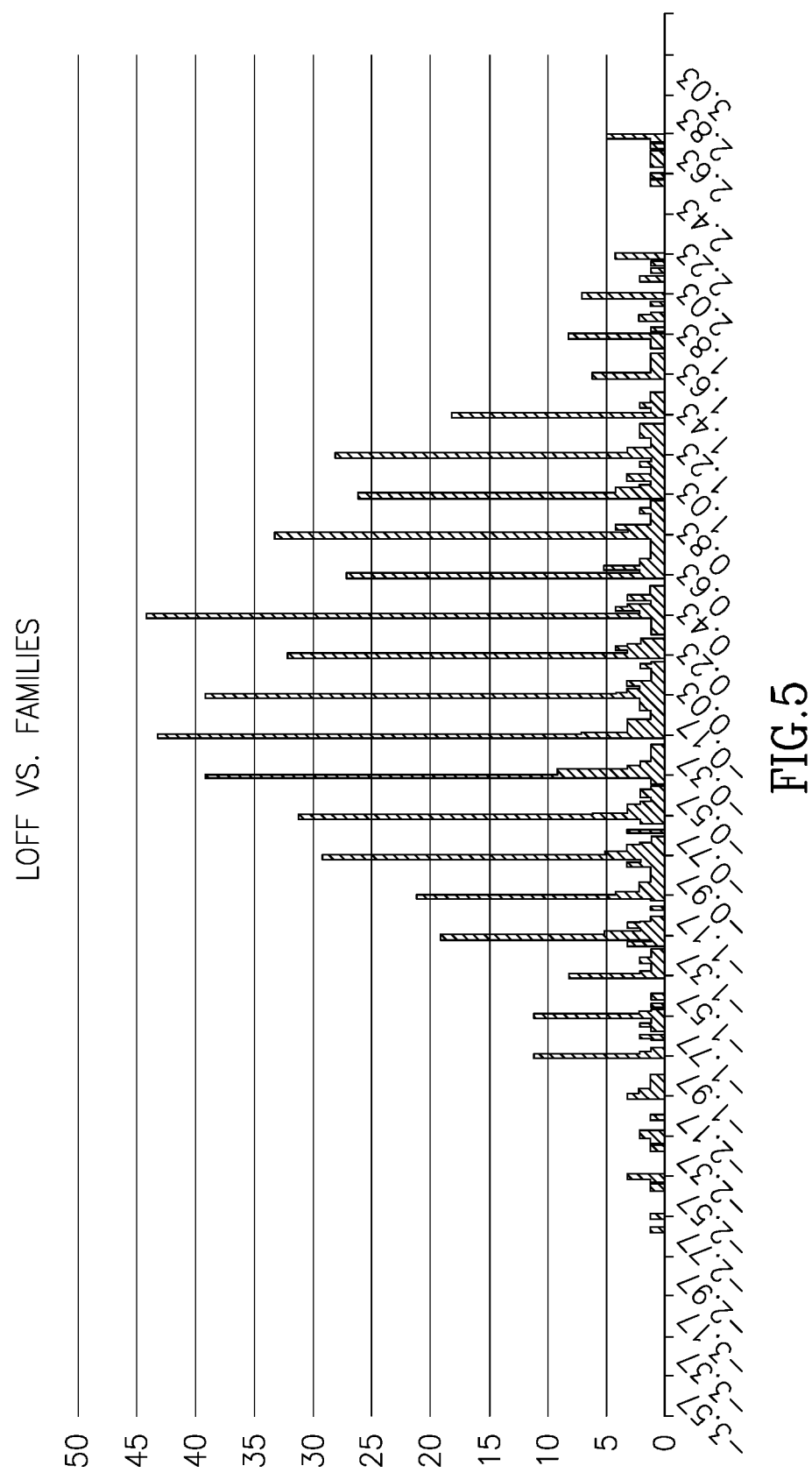
FIG. 5 shows a graph of distributions of values for different IC profiles.

FIG. 5 show the spread of the Pre-Si average leakage-current signature over the profiling process resulted families.

Figure 6:
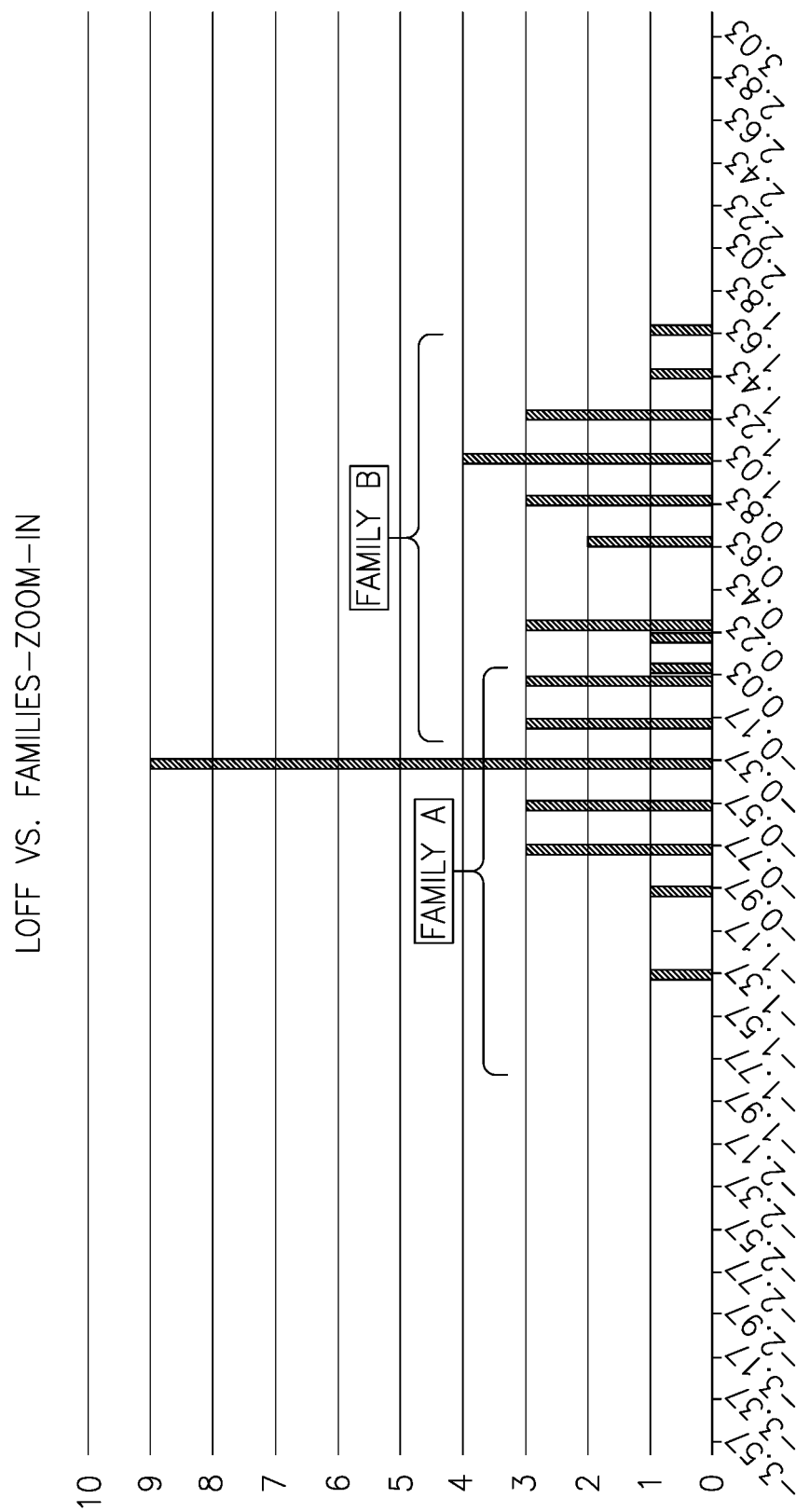
FIG. 6 shows a graph of distribution separation between two different IC profiles.
Figure 7A:
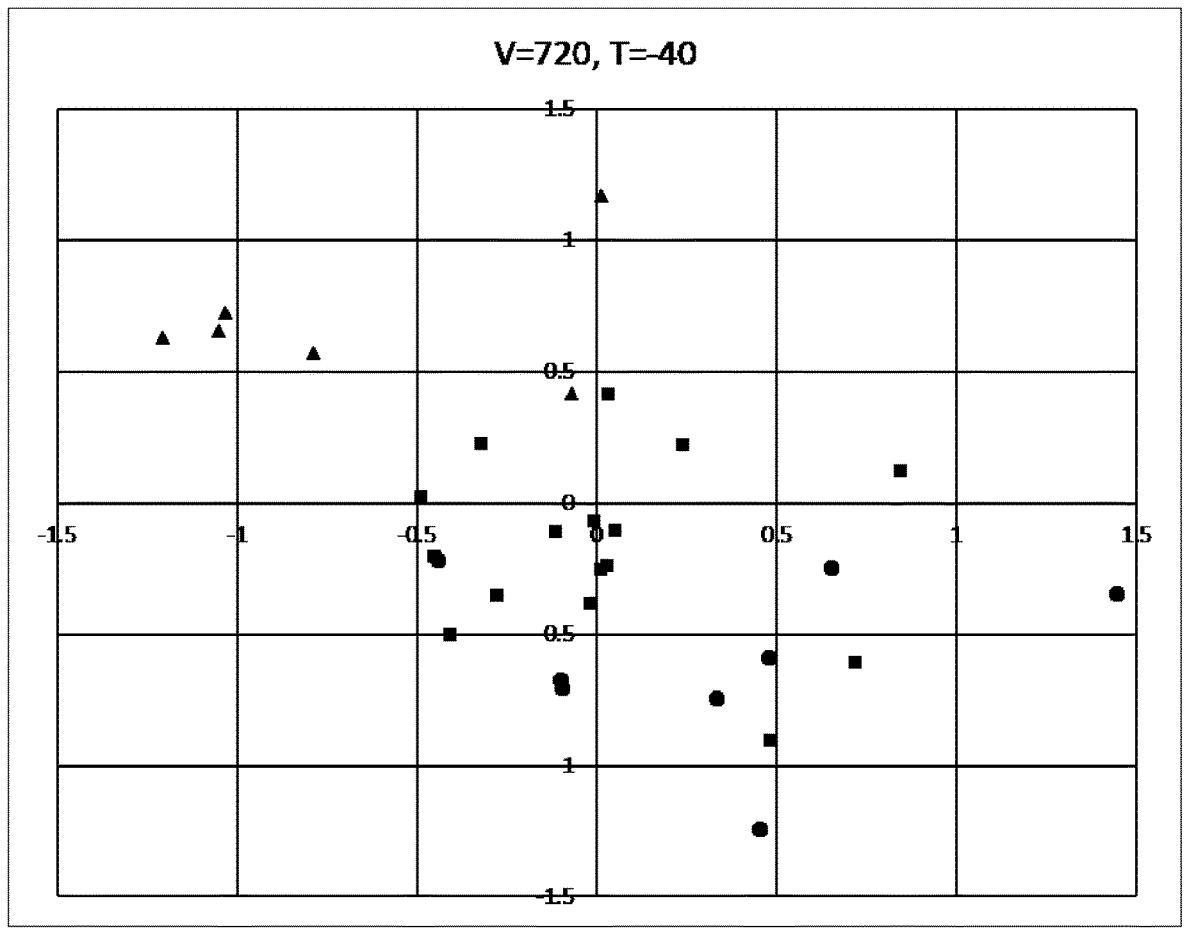
FIGS. 7A thru 7D show a graph of distributions of values for two IC profiles under varying voltage and temperature.
Figure 7B:
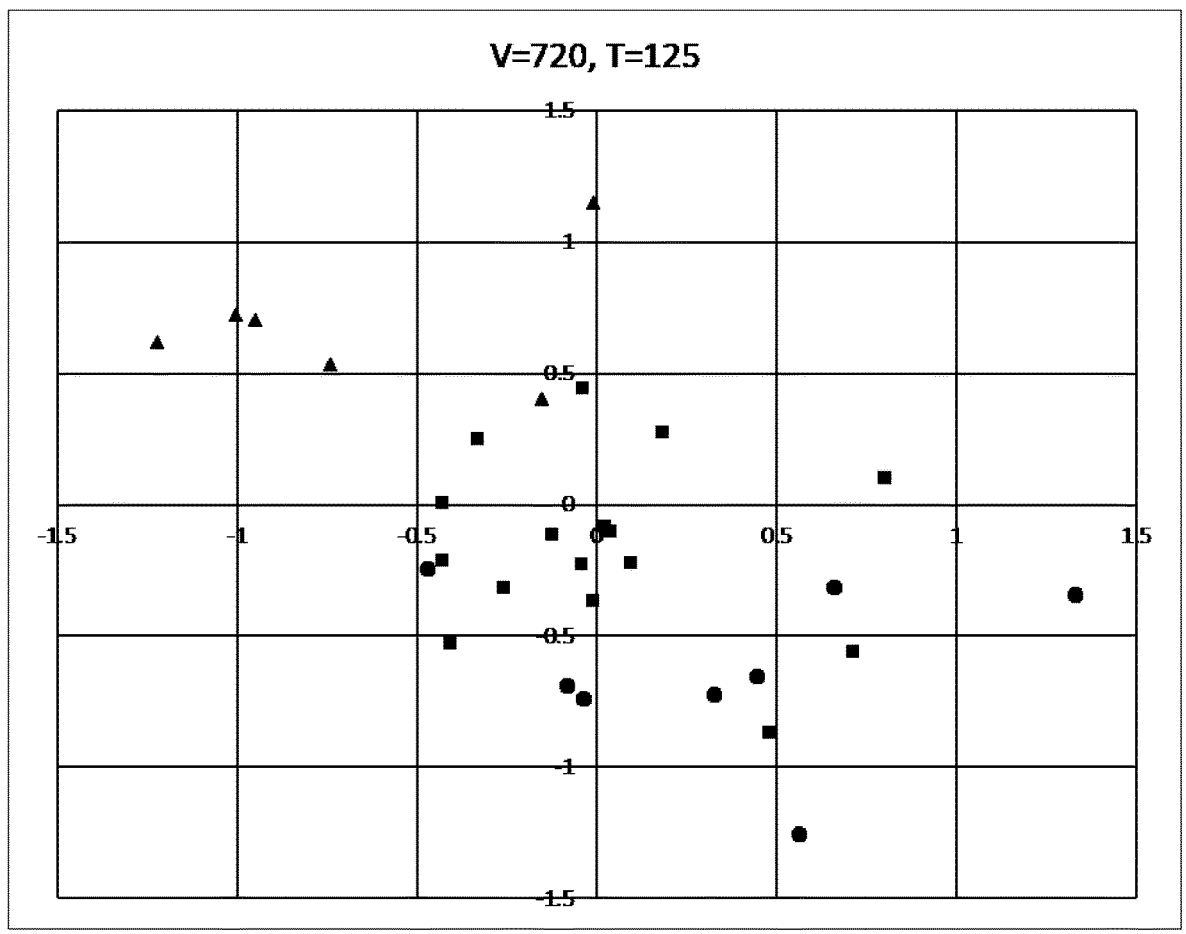
Figure 7C:
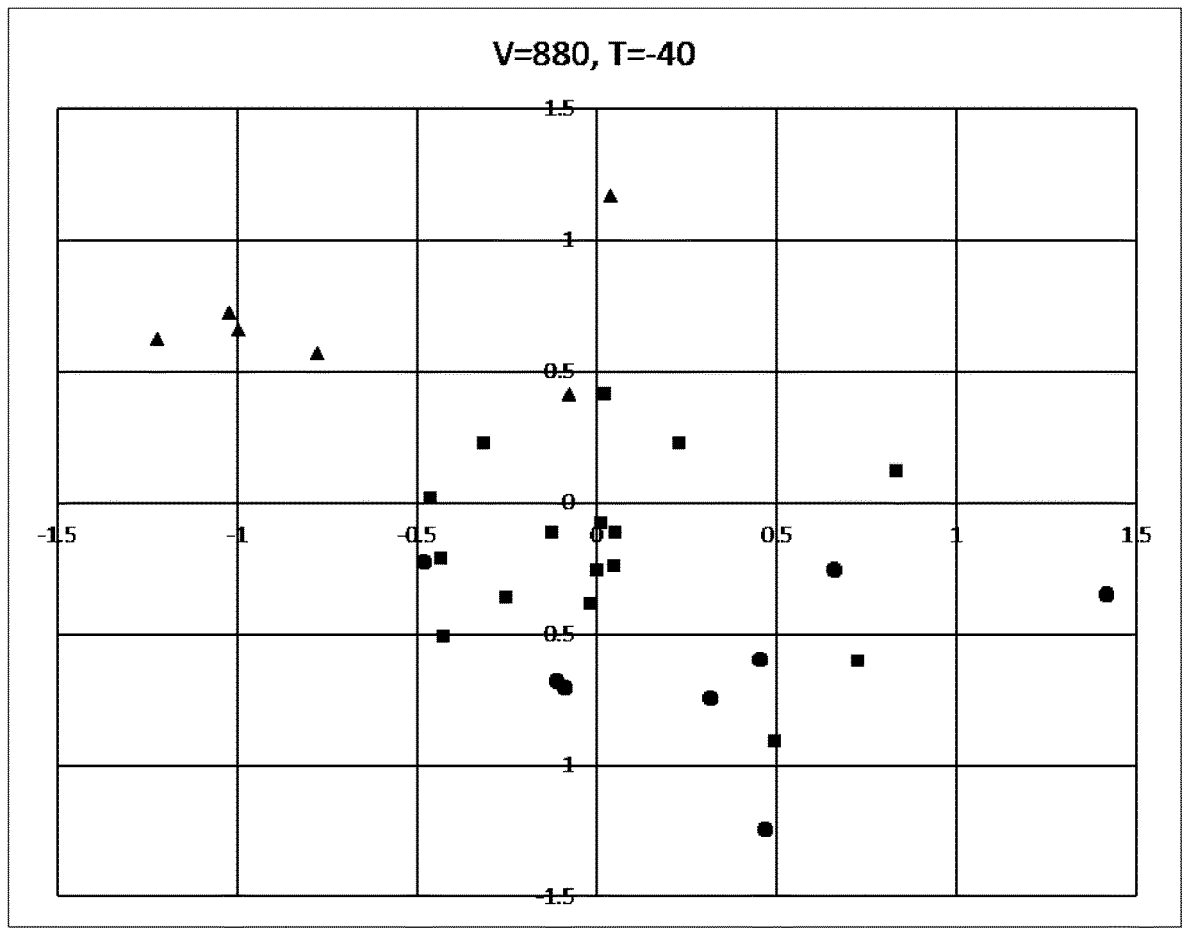
Figure 7D:
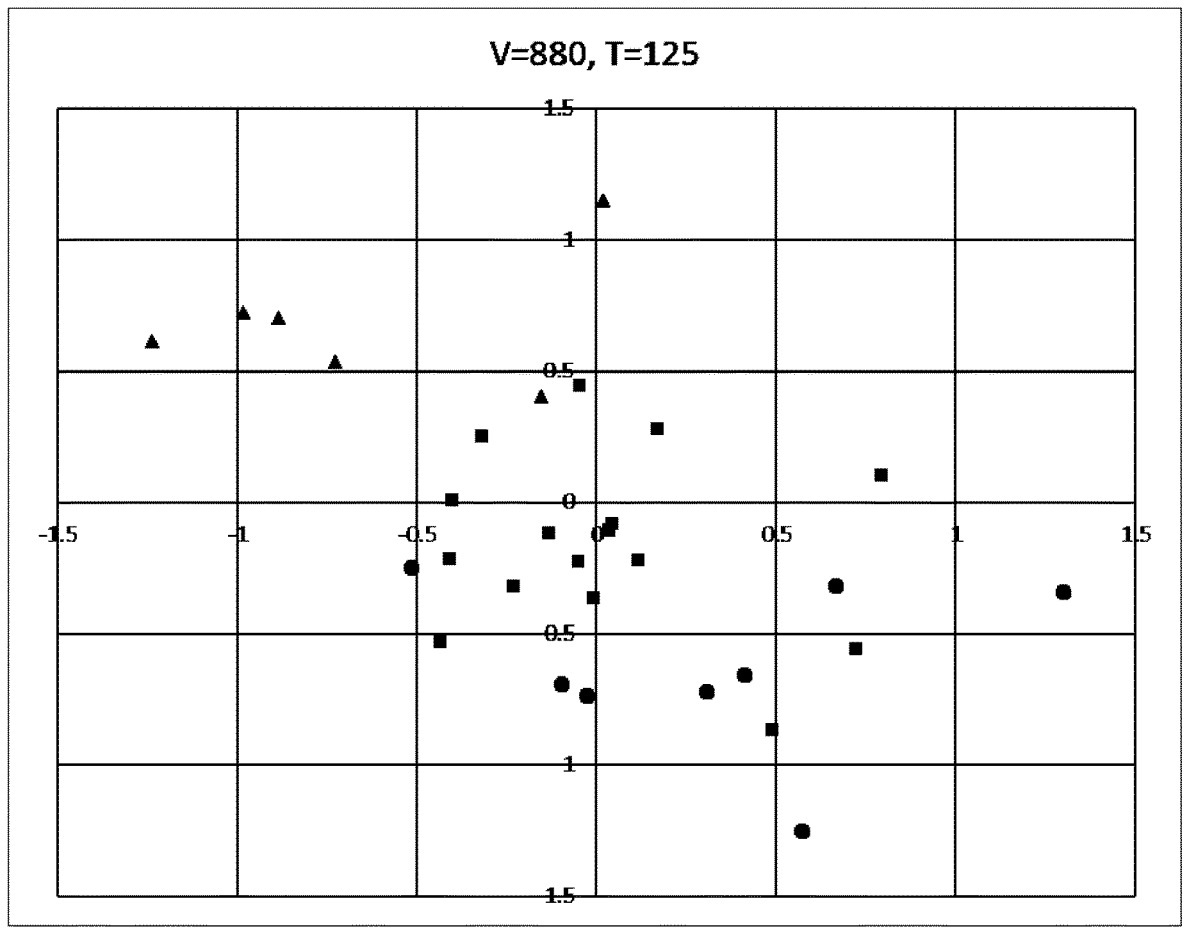

FIG. 6 is a zoom version of FIG. 5 showing 2 families at a bounded sigma range, Family A range: −1.37 to 0.23 sigma's, Family B range: −0.03 to 1.63 sigma's. FIGS. 7A,7B, 7C and 7D show the stability/invariance of the profiling process & resulted families per voltage and temperature.

When the number of the SVD signatures is smaller than the number of the principal components, then the distance computed by the chosen SVD signatures may be smaller than the real distance. For the case of q-norm with 1's as weights and q=2, the real distance between samples i and j defined by $\Delta^F(i,j)$:

$$\Delta^F(i,j) = \sqrt{\Sigma_n (SVD_i^n - SVD_j^n)^2} = \sqrt{\Sigma_n \overline{w}_n (p_i^n - p_j^n)^2}$$

where the left term is a sum over all of the SVD principal vectors and the right term is a sum over all the parameters for which $\overline{w}$ has 1's, namely, those processes parameters were included in the set P. The error definition is as follows:

Let i and j stand for two samples, then the distribution of the error $((\Delta^F(i,j))^2 - (\Delta(i,j))^2)$ is generalized chi-square in which the variances are the singular values not included in $\Delta(i, j)$.

For other norms the above computations would be with respect to the chosen norm.

When the number of the SVD signatures is smaller than the number of the principal components, then for a given process parameter, 2 samples i and j for which $\Delta(i, j)=0$ may have different process value. Denote the distance between the values of a given process parameter of samples i and j by $\Delta^P(i,j)$. Then, $\Delta^P(i,j)$ is normal distributed with zero mean and variance bounded by 2d, where d is the maximal singular value which is not included in $\Delta^{(i, j)}$.

Estimators (such as profilers, classifiers, and/or the like) are functions that generate an output value based on the sensor values. Generating estimators for the SVD signatures based on the sensor's values may be done using a Gaussian estimator, a Lasso estimator, a Ridge regression estimator, Generalized adaptive model estimators, splines, Neural network, and/or the like. The estimation error may be empirically computed by validation data. Based on the error, the distance between each sample to it the associated family is smaller than r+ϵ with a probability smaller than 1−67.

The Protean classifier block classifies dies into families at the Post-Si stage. The input for the block is pre-Si data composed of SVD-signatures estimators and the separation radios, and post-Si sensor values from the testing equipment. Based on the pre-Si estimators, SVD signatures values are computed for each sample. The estimators may be tuned, adjusted, improved and/or the like based on data collected at Post-Si stage. Families are generated as follows:

Define the first sample as a family
Given a new sample
When the distance Δ of the new sample to all of the defined families is larger than the given radius (input)—Define a new family
When not, associate it to the closest family
When a new family has been defined, go over all the samples and associate them to the closest family.

Optionally, families of ICs may be classified Post-Si by the median of device parameters per device types {VT, IDS}×{p,n}×{SVT,LVT}. Each vertex of the polygon represents a normalized device parameter value (in sigma terms) with respect to its typical/center value.

Optionally, histograms may be built per profile and per sensor measurements and or high coverage measurements. For example, post-SI sensor values are collected per family for high coverage measurement and for sensors values. The data may be normalized when it is not normal distributed. A mean and variance may be computed for each data set and based on a desired false-positive rate the bounds on the high coverage measurements may be computed per family. The signatures are re-used for separating to different classes/families. Therefore, they can't be out of a given limit.

Optionally, anomaly testing is done after profiling. For example, testing may measure the bounds of high coverage measurement per family. For example, the family classification of the current die may be used as input for testing. When one of the high coverage measurements of the given die is outside the bounds correspond to the die's family/profile, then the die is classified as outlier. The high coverage measurements bounds may be computed by considering the joint-distribution of the high coverage measurements for each of the families.

Optionally, classification and/or estimators are used for package testing. For example, anomaly testing is done after and/or during High-Temperature-Operating-Life test (HTOL) or Burn-In test (BI). Dies that were classified to the same family by the profiling process belongs to the same Si-profile and are expected to have a close behavior over the same stress conditions. Means that the performance degradation of dies from the same family is expected to be bounded during and after the tests. Dies that show performance degradation outside the family-bounds are identified as outliers and may be rejected.

A high coverage measurement may be an IC-level measurement that reflects the total die behavior, for example, total die leakage at a certain temperature. Another example is the timing-margin of a large-scale paths. The histogram is build according the following steps:

1. post-SI data is collected per family per high coverage measurement
2. Normalize any data that is not normal distributed
3. Compute mean and the variance for each data set
4. Based on a given false-positive rate, bounds on the high coverage measurements are computed per family
5. Alternatively, the bounds on high coverage measurements can be taken as the empirical lower and upper alpha-quantile values, where alpha is determined by the false positive rate. This approach may be applied when a specific high coverage measurement for a given family cannot be normalized and/or the like.
6. Optionally, an estimator may be built for each high coverage measurements based on the the Post-Si data. Then, an histogram on the estimator error, namely, the difference between the estimated value and the real high coverage measurement may be built. Then the above procedure (1-5) may be applied on this histogram.

Figure 8:
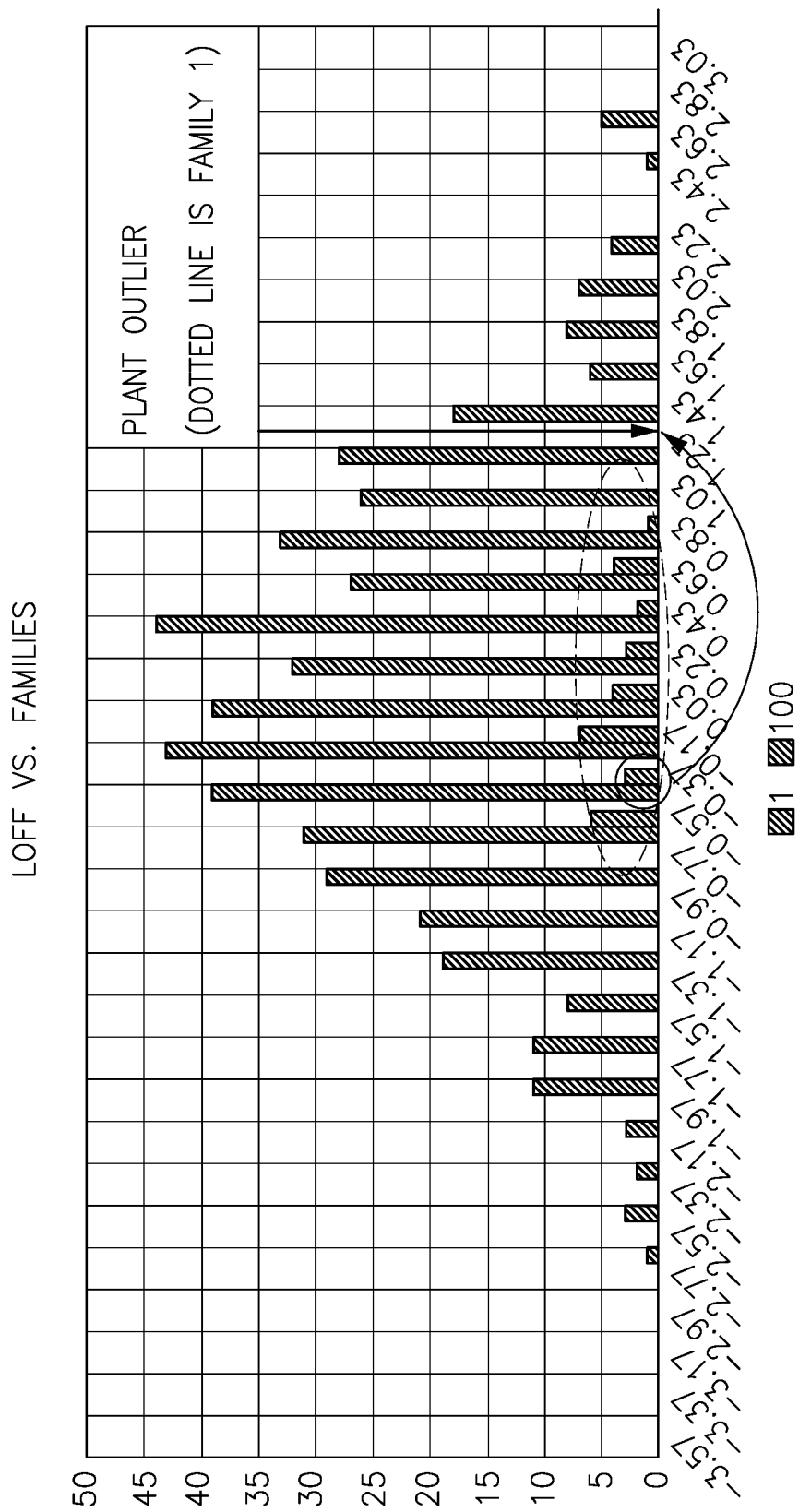
FIG. 8 shows a graphical distribution of simulated values for an IC profile and an outlier.
Figure 9:
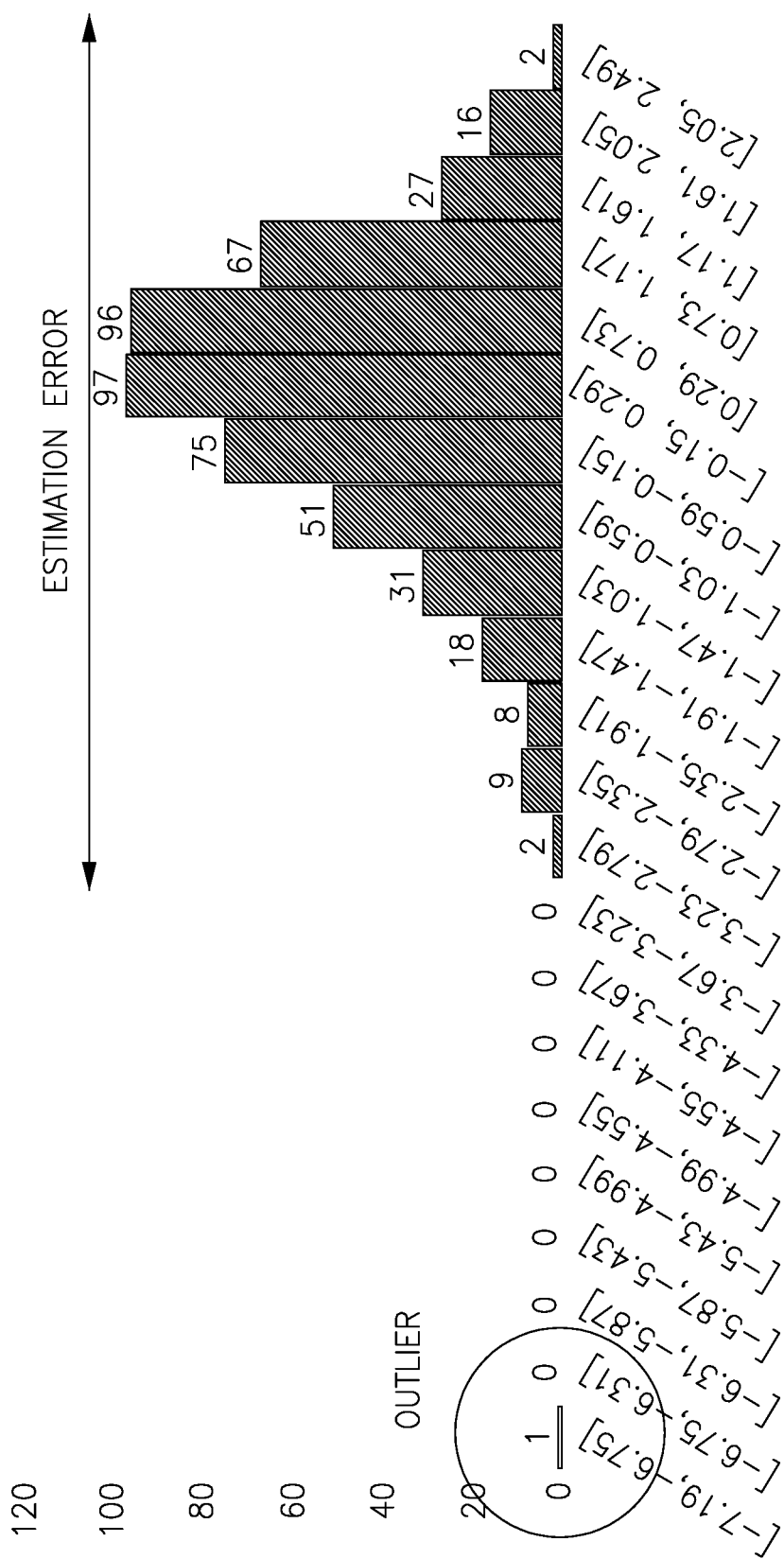
FIG. 9 shows a graphical distribution of the error between the values of a simulated High-coverage measurement and its estimator, while an outlier is planted.

FIG. 8 and FIG. 9 show a demonstration by experiment of the Outlier detection process.

Experiment target:
Plant an outlier in the Average-Ioff signature
Detect the outlier using the Outlier-detection algorithm
Outlier description:
Change MC point 428 by 1s
Equivalent to +35% increase in Ioff
FIG. 9 show the experiment results, the outlier that was shift by 1-sigma is emphasized by the Outlier-detection process as 7-sigma WRT estimator average.

The figures mentioned above (FIGS. 8 and 9) demonstrate outlier's detection based on building histogram (FIG. 8) and estimators (FIG. 9). Namely, an estimator for the high coverage measurement is computed. Then, the measured high coverage value is compared to the estimated one and the die is detected as outlier based on a given false positive rate.

For example, different sensors may yield different cluster separations, and thus have different sensitivities to the sensor selection and locations within the IC design. For example, good separation between the clusters based on Vt NLVT on and Vt PLVT on, but an overlap may exist between the two clusters.

For example, the separation of the average-leakage signature and total leakage signature may determine profiles.

For example, different high coverage parameters may yield different cluster separations, and thus have different sensitivities to detecting an IC's profile classification.

Reference is now made to FIG. 4, which shows a radar (spider) plot of IC profiles. The graph shows the profile, i.e., process origin of profiles 1, 8, and 13. The radar (spider) plots are another way to visualize the process profiles.

Reference is now made to FIG. 5, which shows a graph of distributions of values for different IC profiles.

Reference is now made to FIG. 6, which shows a graph of distribution separation between two different IC profiles.

Reference is now made to FIG. 7A thru 7D, which show a graph of distributions of values for two IC profiles under varying voltage and temperature.

Optionally the profiling process can be performed using only Post-Si data. In such a case, the inputs to the profiling algorithm are: a) radius R; b) a file of ICs agents' readouts; c) a smooth parameter $\lambda$; and d) a constant k.

The profiling algorithm is performed by the following steps: 1) For each IC, create a representative vector (an example of the representative vector for a given IC is $v_{ic1}=(Ag_1, Ag_2, \ldots Ag_n)$, in which $Ag_n$ stands for the readout of agent n of the given IC; 2) create a matrix such that each row is the representative vector of one of the dies (namely, the number of rows is the number of ICs, and the number of columns is the length of the vectors representing the IC); 3) scale the matrix such that the average of each column is 0 and the sigma is 1 (as a product of this, each agent has its own normalization coefficients, the normalized representative vector of IC1 is denoted by $\bar{v}_{ic1}$, namely, the vector's values are the normalized agents' readouts); 4) compute the covariance matrix of the scaled matrix (as computed at 3); 5) perform SVD process on the covariance matrix and denote the results by UDV; 6) compute the distance matrix as follows: dist_mat=U*D', where D' is the diagonal matrix D in which the first k values ($d_k$) are replaced with $$\sqrt{\frac{d_k}{d_k+\lambda}},$$

the rest of the values are replaced with zeroes (namely, given D:

$$\begin{pmatrix} d_1 & 0 & 0 \\ 0 & d_2 & 0 \\ 0 & 0 & d_3 \end{pmatrix},$$

for k=1 and $\lambda$, D' is:

$$\begin{pmatrix} \sqrt{\frac{d_1}{d_1+\lambda}} & 0 & 0 \\ 0 & 0 & 0 \\ 0 & 0 & 0 \end{pmatrix};$$

7) create the families based on the procedure described in "Profiling step (2)" above with the following distance computation, in which the distance between ic1 and ic2 is: $\Delta = \sqrt{(\bar{v}_{ic1}-\bar{v}_{ic2})*UD'*(UD')^T*(\bar{v}_{ic1}-\bar{v}_{ic2})^T}$, $\bar{v}_{ic1}$ and $\bar{v}_{ic2}$ are the normalized vectors representing ic1 and ic2 respectively and D' is the matrix computed in step 6.

Optionally, the distance between ic1 and ic2 can be calculated as follows: $\Delta=\max|(\bar{v}_{ic1}-\bar{v}_{ic2})*UD'|$ (using the same notation as above).

Optionally the profiling process described in the immediately preceding paragraphs can be performed in an incremental mode. In other words, the Post-Si data may arrive in batches or by using Pre-Si & and Post-Si data, in which the Pre-Si data is considered the first batch.

In such a case, the profiling algorithm is described as follows (with an example of using Pre-Si as first batch and then Post-Si data as a second batch): 1) run the post-Si data algorithm with the pre-Si data instead of the post-Si data (the normalization coefficients of each agent and the distance matrix should be stored and at this stage, the Families are generated based on the Pre-Si data); 2) when the post-Si data has arrived, normalize it with the normalization coefficients computed based on the pre-Si data, with the distances being computed using the distance matrix computed based on the pre-Si data; and 3) the algorithm uses the new data to generate new families: if possible, it will add the new data to the pre-defined families and if not, it will create new families, making sure that each of the new data is associated to the closest family (new/pre-defined).

The algorithm will check if additional agents are needed to improve its performance. It will be done by performing the following steps using the Pre-Si data: 1) compute the distance between all the MC points; and 2) for each signature and/or process parameter, compute the distance (in sigmas) between all the MC points.

Then, for each of the signature and/or process parameter, check if there exists a constant (const), such that: $\text{dist}_{sig/proc}(MC_i \leftrightarrow MC_j) \leq \text{const} \times \text{dist}_{profiling}(MC_i \leftrightarrow MC_j)$. The const value should not be large such that the equations always holds, namely, const value should be such that const$\times \text{dist}_{profiling}(MC_i \leftrightarrow MC_j) \leq r$ for some fraction of the number of MC points which is stable when we enlarge the number of MC.

In a generalized sense, there may be considered a (computerized) method for IC classification and/or outlier detection. The method uses a wafer comprising a plurality of ICs in accordance with an IC design. The IC design comprises a plurality of sensors (which may provide diagnostic and/or performance information regarding the functionality of the IC). The method comprises using at least one hardware processor for testing each of the plurality of ICs. This is advantageously effected by: collecting a plurality of sensor values, the plurality of sensor values including sensor values from each of the plurality of sensors (preferably at least one sensor value from each of the sensors); comparing the plurality of collected sensor values to a classification scheme, thereby obtaining a classification for each tested IC. Beneficially, the classification of each tested IC is then recorded. In embodiments, the method may include manufacturing the wafer based on the IC design using a fabrication process.

The step of comparing the plurality of collected sensor values to a classification scheme may include determining or identifying the classification scheme in embodiments. The classification scheme is optionally based on one or more sets of data. For example, the one or more sets of data may include: simulations of a plurality of IC operations of the IC design and the fabrication process (in which case, the simulations may be at least one of at least one complete IC design simulation, at least one partial IC design simulation, and at least one device simulation for the fabrication process); a plurality of training sensor values collected during a pre-production tape-out test; and the collected plurality of sensor values. In other words, the sets of data may include pre-Si and/or post-Si data. In embodiments, the classification scheme may comprise an outlier class. The classification may comprise a hierarchical data structure for determining the classification of each die.

The step of comparing preferably comprises estimating high coverage measurements from the plurality of sensor values using at least one of a function and a rule. The function and/or rule may be determined from a training set of sensor values and training high coverage measurements, for example.

Various uses of the classifications of the tested ICs may be made. For example, the at least one hardware processor may be used for: marking an IC package of the tested IC with unique identifications based on the classification; and/or discarding a defective IC. In an approach, from each tested IC, a set of parameters of the fabrication process may be determined based on the classification and the plurality of sensor values. Then, a second set of parameters of the fabrication process may be selected based on the IC design and the sets of parameters of the fabrication process for each IC. A second manufacturing of a second wafer may then be performed using the second set of parameters. The selecting is advantageously performed by at least one of a manual process and an automatic computation. In that way, a wafer comprising a plurality of ICs is provided in accordance with an IC design, in particular with the IC design comprising a plurality of sensors.

In some embodiments, the classification scheme may be identified based on a plurality of classification values. The classification values may be based on one or more of: Pre-Si or simulated sensor values; Pre-Si design signatures; operational parameters determined from a simulation of the IC design (Pre-Si Catalog simulated values) and Post-Si measured sensor values. The classification values are preferably normalized. The classification scheme may be implemented by the following process. Initially, a matrix representation is established from the plurality of classification values, each row of the matrix representation comprising classification values in respect of one of the plurality of ICs (in other words, a matrix in which each column relates to a specific, different parameter, such as a sensor value or other data and each row relates to a certain IC, although the transverse of such a matrix could be used in other implementations). The process may continue as follows: computing a covariance matrix from the matrix representation and a singular value decomposition (SVD) for the covariance matrix; determining, using the SVD (in a variety of ways, as will be discussed below), a plurality of distance values. Each distance value represents a respective distance between one IC of the plurality of ICs and another IC of the plurality of ICs (for instance, based on known mathematical techniques for determining such distance values); and identifying, from the plurality of distance values, at least one family, thereby defining the classification scheme (in particular, comparing the distance values against a threshold, specified as a radius).

Two particular classification approaches are considered: direct and indirect. In a direct method, each of the ICs is represented by a vector based on sensor values (these may be the collected sensor values for Post-Si data and/or the simulated sensor values for Pre-Si data). A matrix is defined based on the sensor values (each row of the matrix being a vector for a single IC), which are advantageously normalized. The covariance matrix of this matrix is calculated. A SVD is performed on the covariance matrix and the SVD (specifically, the principal values from the SVD) is used to create a distance matrix. Beneficially, the distance matrix is also determined using a smoothing parameter $\lambda$ and a constant (integer) k (such that only the first k principal values from the SVD are used). The distances between ICs are calculated from the distance matrix and the (normalized) vectors for the ICs. The ICs are grouped based on their distances from one another (within a "radius") to define the Families. Each Family may be identified by a representative vector. When both Pre-Si and Post-Si data are used, the distance between the measured IC using the Post-Si data and a representative vector for each Family defined using Pre-Si data is also calculated.

In the indirect classification method, a matrix is defined based on Pre-Si data, such as one or more of: (normalized) simulated sensor values; operational parameters determined from a simulation of the IC design (Catalog values); and (normalized) design Signature values (each row of the matrix being a vector for a single IC). The covariance matrix of the matrix is calculated. An SVD is performed on the covariance matrix. A set of Pre-Si SVD signatures are defined/denoted by identifying vectors of the SVD for which the corresponding principal values of the SVD are greater than a pre-defined value (d) and/or identifying vectors of the SVD for which the corresponding principal values of the SVD are the greatest (maximal). The plurality of distance values may be determined using the set of Pre-Si SVD signatures (specifically, if only Pre-Si data is used). For example, at least some of the plurality of distance values may be calculated, each of the at least some of the plurality of distance values being based on a distance between one of the Pre-Si SVD signatures and another of the Pre-Si SVD signatures. If Post-Si data is used, a plurality of estimators are configured (built) from the simulated sensor values and the set of Pre-Si SVD signatures. Each estimator is configured to generate an estimated SVD signature from input sensor values. Each of the ICs (At Post-Si) and MCs (At Pre-Si) represented by its own SVD signatures values. Then the plurality of estimators are used to estimate, for each of the plurality of ICs, a respective Post-Si SVD signature from the plurality of collected sensor values. At least some of the plurality of distance values are calculated, wherein each of the at least some of the plurality of distance values is based on a distance between one of the Post-Si SVD signatures and another of the Post-Si SVD signatures. The ICs are grouped based on their distances from one another (within the "radius") to define the Families. Each Family may be identified by a representative vector (from the signatures). When both Pre-Si and Post-Si data are used, the distance between the measured IC using the Post-Si data and a representative vector for each Family defined using Pre-Si data is also calculated. In other words, further distance values of the plurality of distance values are calculated, each of the further distance values being based on a distance between one of the Pre-Si SVD signatures and one of the Post-Si SVD signatures.

The identification of one or more families, from the plurality of distance values, may typically comprise: classifying a first IC of the plurality of ICs in a first family, such that the first family is defined by the first IC (in other words, the first IC analyzed may always define a new family, since no families have previously been defined and thus, the first IC represents the first family); comparing a distance value, from the plurality of distance values, representing a distance between the first IC and a second IC of the plurality of ICs with a predetermined threshold (for example, such that the distance value between the two ICs is either greater than or less than the threshold); if the distance value is less than the predetermined threshold, classify the second IC in the first family (because the distance between the two ICs is small, so that they are considered to be in the same family); and if the distance value is greater than the predetermined threshold, classify the second IC in a second family, such that the second family is defined by the second IC (in other words, such that a new family is defined and this family is represented by the second IC). The case where the distance value is same as the predetermined threshold is left to implementation as such cases would be extremely rare and therefore the classification for the second IC could be defined as the first family (with the first IC) or a new, second family without causing difficulties.

This approach may be repeated for each of the ICs in the plurality of ICs. For instance, the identifying of the plurality of families, from the plurality of distance values, may further comprise a procedure for each other IC of the plurality of ICs. This procedure may proceed in the following way. Initially, a group of distance values, from the plurality of distance values, are identified. Each distance value in the group of distance values represents a distance between the other IC and a respective IC of the plurality of ICs that defines a respective family (in other words, the group of distance values may only be concerned with distance values between the other IC, which is the IC being classified, and each of the ICs that represents a family). Each distance value from the group of distance values is then compared with the predetermined threshold (this is advantageously the same predetermined threshold as used for the first and second ICs and is beneficially the same for all ICs on the same wafer). A number of results are possible from this comparison. If a distance value from the group of distance values, which represents a distance between the other IC (that is the IC currently being classified) and a specific IC of the plurality of ICs that defines a specific family (that is, an IC that represents a family), is less than the predetermined threshold, the other IC is classified in the specific family (such that the two ICs are considered in the same family). This condition, if it is met at all, should only be met for one family. If all the distance values from the group of distance values are greater than (or, depending on the implementation, greater than or equal to) the predetermined threshold, the other IC is classified in a new family, such that the new family is defined by the other IC. This procedure is advantageously repeated for each unclassified IC (other IC) until all of the plurality of ICs have been classified.

As previously indicated, the plurality of classification values may be based on one or more of: simulated sensor values determined from a simulation of the IC design (Pre-Si data); one or more design signatures; a plurality of training sensor values collected during a pre-production tape-out test; and measured sensor values for a batch of devices, which may include any number of ICs, a lot, many lots and/or the wafer (Post-Si data). When only Post-Si data is used, for instance, the plurality of classification values may be based on the collected sensor values for the wafer. Then, the identification of the classification scheme based on the plurality of classification values may be at least part of the step of comparing the plurality of collected sensor values to a classification scheme, thereby obtaining a classification for each tested IC. Alternatively, the identification procedure may be followed first for the Pre-Si data (for instance, such that the plurality of classification values are based on simulated sensor values determined from a simulation of the IC design), resulting in Families being identified. Then, the step of identifying the classification scheme based on a plurality of classification values may take place before the step of comparing the plurality of collected sensor values to a classification scheme, thereby obtaining a classification for each tested IC (in particular using Post-Si data, especially based on a distance matrix and/or distance function, as described herein). The comparing of the plurality of collected sensor values to a classification scheme may be implemented by following a further procedure (in the direct approach discussed above), as follows. A collected data matrix representation may be established from the plurality of collected sensor values. Each row of the matrix representation comprises collected sensor values in respect of one of the plurality of ICs (such that the collected data matrix representation has the same format as the matrix representation discussed above). From the collected data matrix representation, a plurality of collected data distance values may be determined. Each distance value represents a respective distance between one IC of the plurality of ICs and another IC of the plurality of ICs, with the plurality of ICs preferably including both simulated ICs (from the step of identifying) and actual ICs (from the collected data), considered as separate ICs (although the simulated ICs will normally be simulations of the actual ICs). The distances between the plurality of the Post-Si ICs and/or the plurality of the Pre-Si ICs are thereby computed by the distances functions/matrix computed based on the Pre-Si data. From the plurality of distance values, each of the ICs may then be classified according to the classification scheme. This classifying advantageously follows the procedure discussed above (in the preceding two paragraphs).

In any of these approaches, the matrix representation may be normalized, for example prior to computing the covariance matrix from the matrix representation (in other words, the covariance matrix is computed from the normalized matrix representation). Normalization coefficients may be defined thereby. Where Pre-Si and Post-Si data are both used, collected data matrix representation may be normalized using the defined normalization coefficients (that is, from the Pre-Si data).

Figure 11:
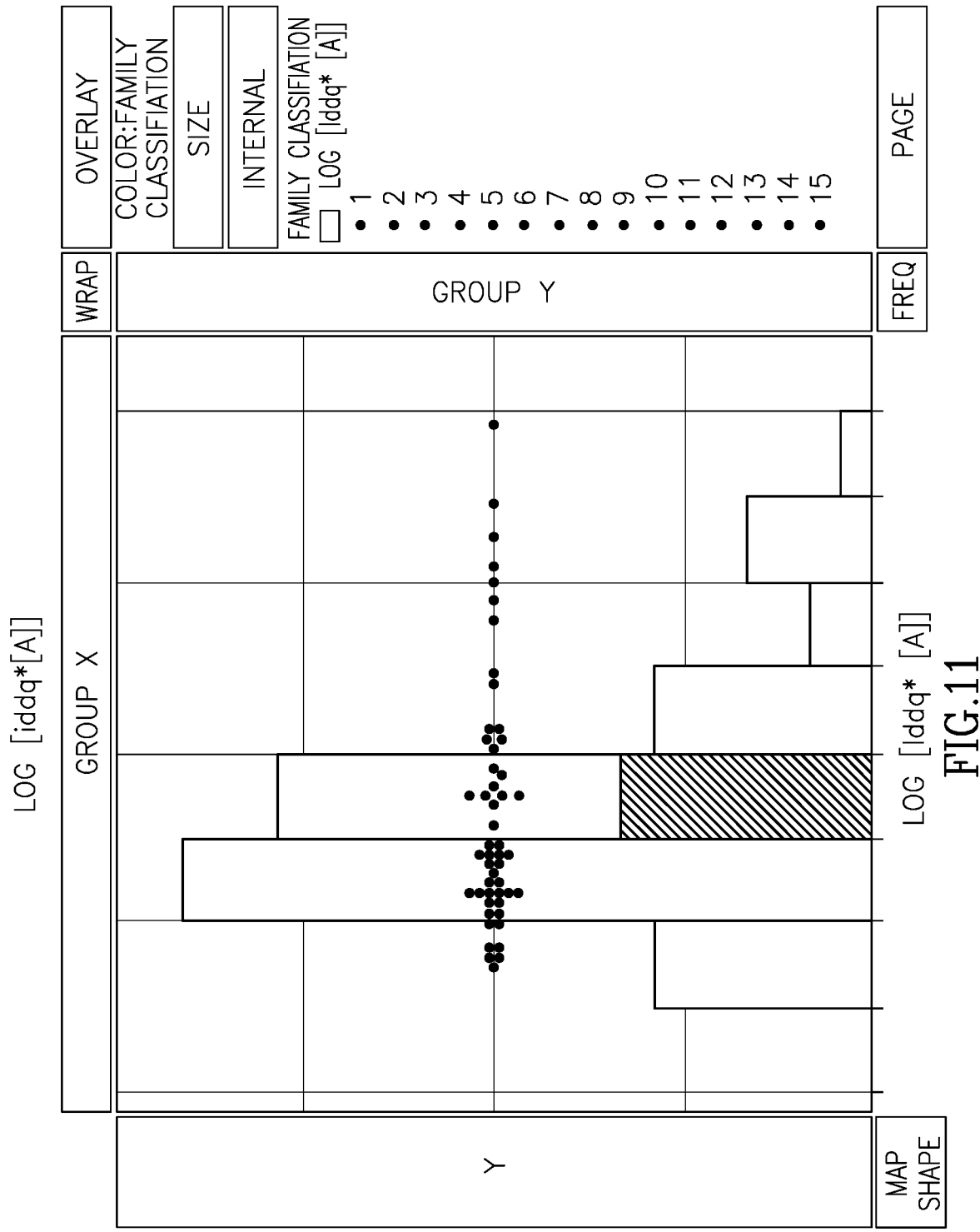
FIG. 11 shows example IDDQ measurement distributions for devices formed on a wafer, classified into families.

Experimental data is now provided to show that the classification of Families, as disclosed herein, is invariant to other physical Si parameters and temperature. Referring now to FIG. 11, there are shown example IDDQ measurement distributions for devices formed on a wafer, classified into families. The ICs were profiled/classified into Families based on data from a post-Si agent. Family 2 is highlighted in the drawing. The measured IDDQ (Ioff current or leakage current) of each of the ICs is also presented in the plot, showing the distribution of IDDQ within the wafer. The results of the profiling process are that different Families were created per the different Si type, that the IDDQ range of each Family is narrower than the IDDQ distribution range of the whole wafer (the full Si range). This evidences that ICs were profiled based on physical Si parameters.

Figure 12:
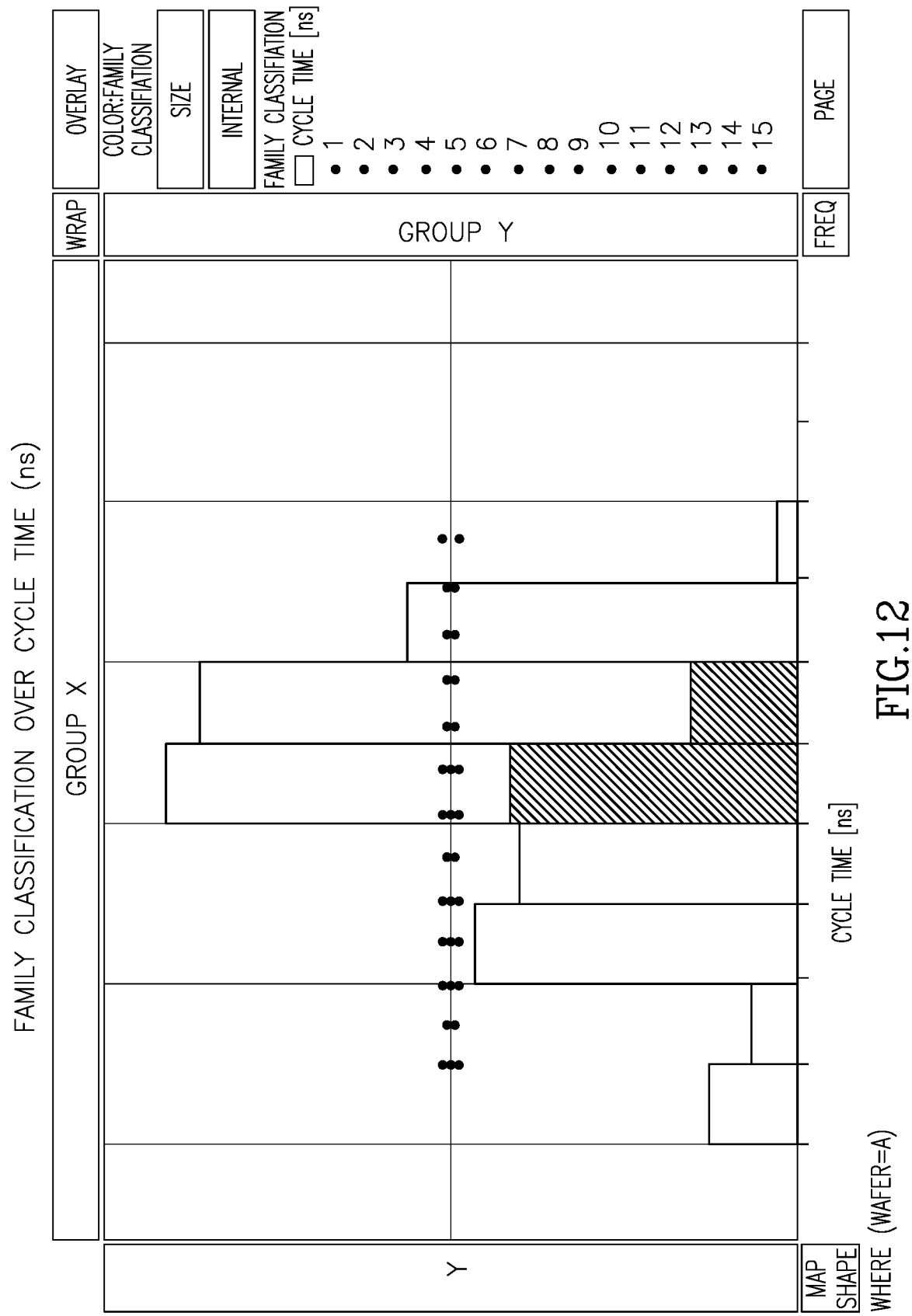
FIG. 12 shows example cycle-time measurement distributions for devices formed on a wafer of FIG. 11, classified into families.

Referring now to FIG. 12, there are shown example cycle-time measurement distributions for the devices formed on a wafer of FIG. 11, classified into families. The ICs were profiled/classified into Families based on data from a post-Si agent. Family 2 is highlighted. The measured cycle-time of each of the ICs is also presented in the plot, showing the distribution of cycle-time within the wafer. The results of the profiling process are that different Families were created per the different Si type, that the cycle-time range of each Family is narrower than the cycle-time distribution range of the whole wafer (the full Si range). This further evidences that ICs were profiled based on physical Si parameters.

Figure 13:
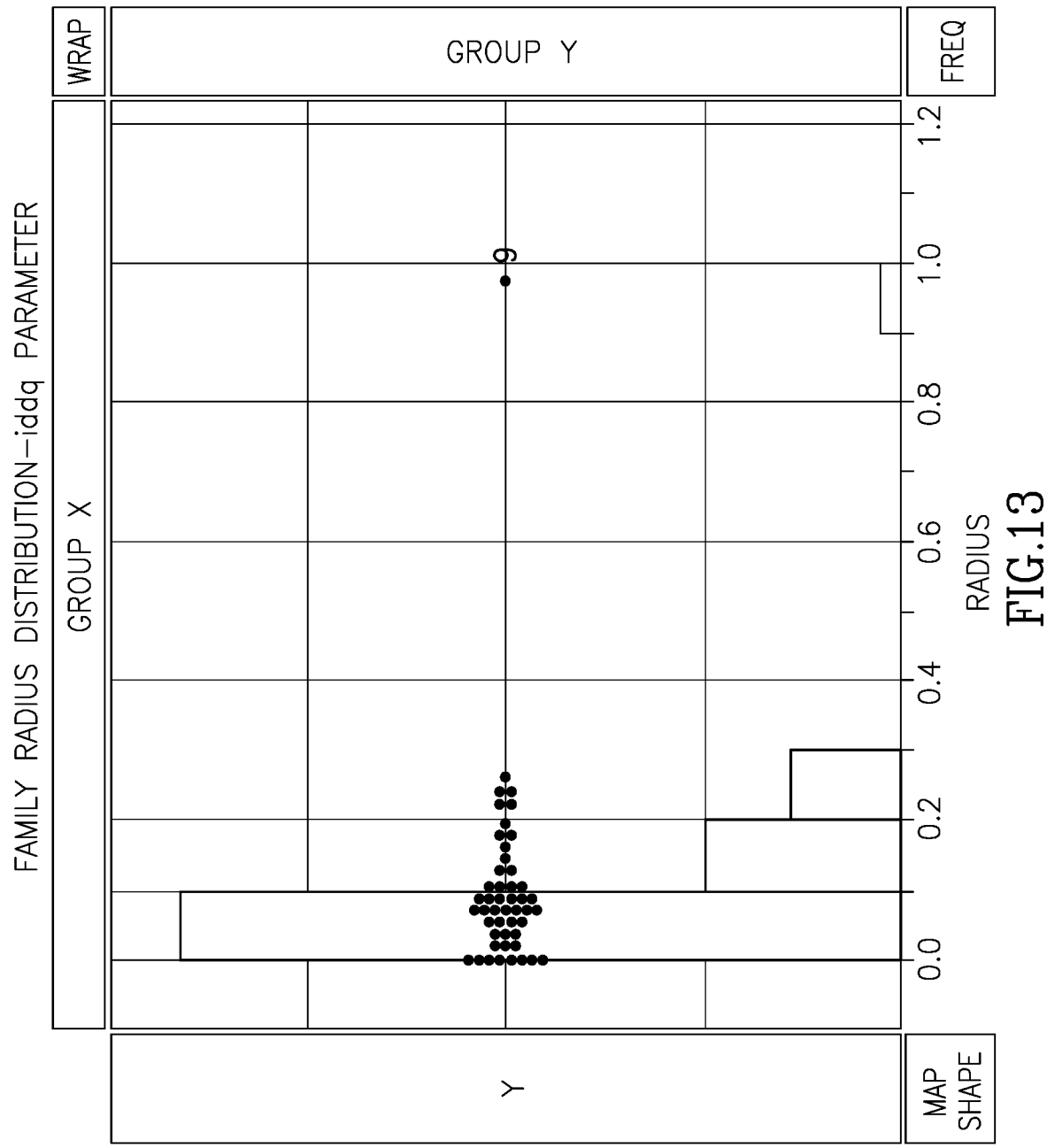
FIG. 13 shows, for the ICs formed on a wafer of FIG. 11, a histogram of differences between IDDQ measurements and the average value for the Family associated with the respective IC.

Referring now to FIG. 13, there is shown, for the ICs formed on a wafer of FIG. 11, a histogram of differences between IDDQ measurements and the average value for the Family associated with the respective IC. This illustrates the reduced IDDQ range within a Family. The histogram shows the distribution relative to an average: for each of the ICs, the value is the difference between the IC measured IDDQ to family IDDQ-center in terms of $\sigma(IDDQ)$. This histogram shows the typical distance of ICs to their family's centers with respect to the IDDQ measurement. It was observed that the typical distance is not affected by temperature changes. Hence, the Families that were generated are invariant to the temperature which evidences that ICs were profiled based on physical Si parameters.

Figure 14:
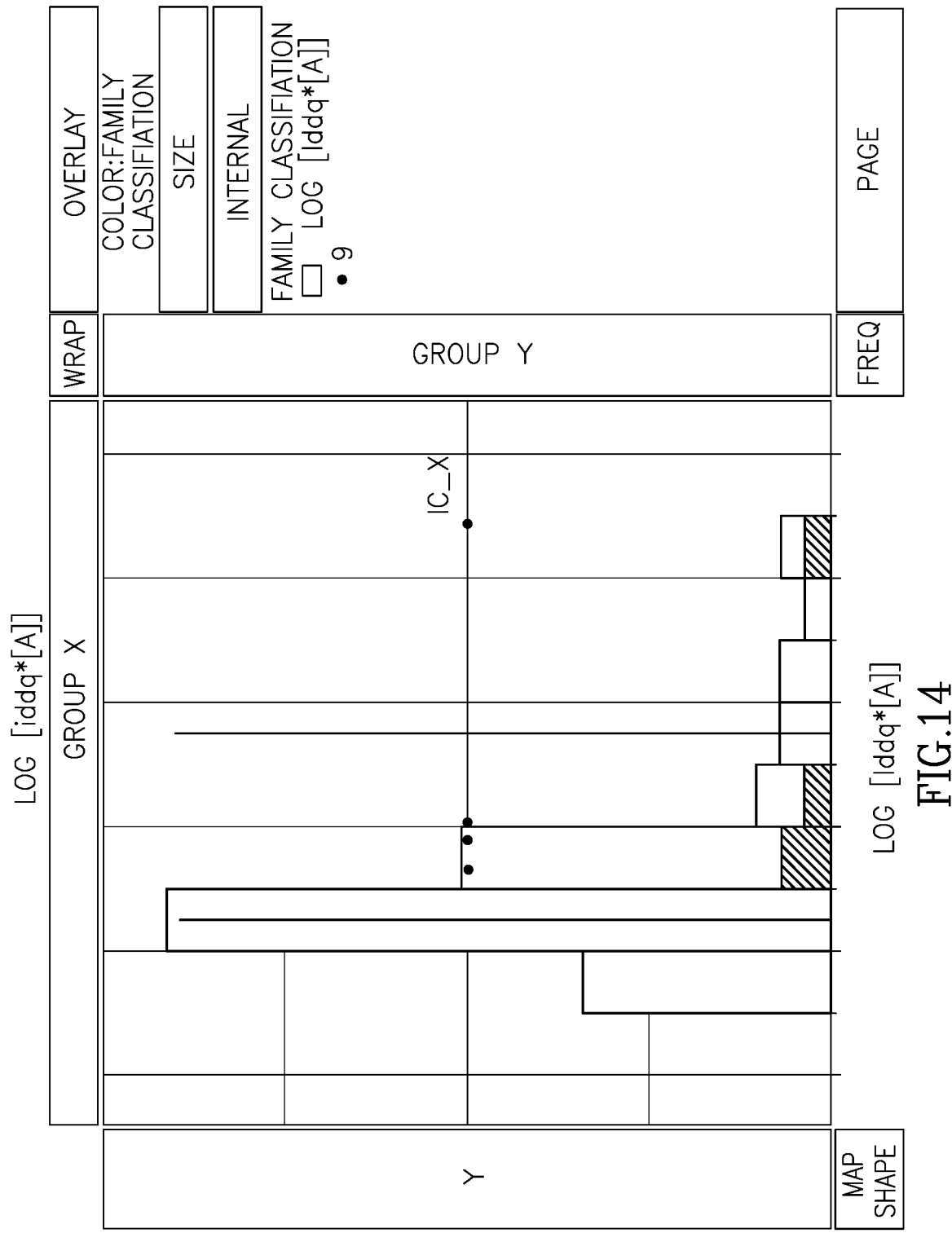
FIG. 14 shows the data shown in FIG. 11, illustrating identification of an outlier die.

Referring now to FIG. 14, there is shown the data shown in FIG. 11, illustrating identification of an outlier IC. The outlier IC was identified by implementing the concept of Family correlation to a High-Coverage Measurement (HCM). In this case, the HCM is IDDQ. The outlier is IC_x which is one of the ICs that belongs to Family number-9. IC_x passed the IDDQ test with respect to the full Si sample, i.e. IC_x measured IDDQ value is within the range of the full Si sample IDDQ distribution. IC_x also passed the IDDQ test with respect to the IDDQ distribution of Wafer-A, i.e. its IDDQ measurement is within the IDDQ distribution of its own wafer. IC_x was identified as an outlier with respect to the measured IDDQ distribution of Family number-9. From FIG. 13, it can be observed that the average sigma value of a Family-IDDQ that was generated by the profiling algorithm is around 0.15. The distance for IC_x from the center of Familiy-9 (its own Family) is 1.55 sigma. Its distance, in terms of number of sigmas, is in the order of 10 (1.55/0.15). On that basis (having a distance that is at least a predetermined multiple of the average distance within the family), it was detected as an outlier.

The measurements for classification of the ICs into Families were performed at three different temperatures: low-temperature (−5 C.); medium temperature (25 C.); and high temperature (85 C.). The Families that were generated were found invariant to the temperature. This evidences that ICs were profiled based on physical Si parameters.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein, and in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. Even though the preferred embodiments are described in the context of a PLL operating at exemplary frequencies, the teachings of the present invention are believed advantageous for use with other types of circuitry in which a circuit element, such as an inductor, may benefit from electromagnetic shielding. Moreover, the techniques described herein may also be applied to other types of circuit applications. Accordingly, other variations, modifications, additions, and improvements may fall within the scope of the invention as defined in the claims that follow.

Embodiments of the present invention may be used to fabricate, produce, and/or assemble integrated circuits and/or products based on integrated circuits.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Rather, the computer readable storage medium is a non-transient (i.e., not-volatile) medium.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A computer program product comprising computer readable instructions that are configured, when operated on at least one hardware processor, to:
    collect at least one sensor value from each of a plurality of sensors that are comprised in multiple Integrated Circuit (IC) dies that are manufactured according to a common IC design, wherein the at least one sensor value is indicative of field performance of the respective IC die; and
    classify each of the multiple IC dies based on the field performance indicated by the at least one sensor value.

2. The computer program product of claim 1, wherein the instructions are further configured to compare the collected at least one sensor value to a classification scheme, thereby enabling the classification of each of the multiple IC dies.

3. The computer program product of claim 2, wherein the classification scheme is based on at least one of:
    simulations of a plurality of IC operations of the common IC design and a fabrication process, wherein the simulations are selected from the group consisting of: at least one complete IC design simulation, at least one partial IC design simulation, and at least one device simulation for the fabrication process;
    a plurality of training sensor values collected during a pre-production tape-out test; or
    the collected at least one sensor value.

4. The computer program product of claim 2, wherein the comparing comprises:
    estimating high coverage measurements from the collected at least one sensor value using a function and/or a rule that are determined from a training set of: sensor values, and training high coverage measurements.

5. The computer program product of claim 1, wherein the instructions are further configured to:
    (i) from each of the IC dies, determine a set of parameters of a fabrication process based on the classification and the collected at least one sensor value; and
    (ii) select a second set of parameters of the fabrication process based on the common IC design and the sets of parameters of the fabrication process for each of the IC dies,
    to enable manufacturing additional IC dies using the second set of parameters.

6. The computer program product of claim 2, wherein the instructions are further configured to:
    determine the classification scheme based on a plurality of classification values by:
        establishing a matrix representation from the plurality of classification values, each row of the matrix representation comprising classification values in respect of one of the IC dies;
        computing a covariance matrix from the matrix representation and a singular value decomposition (SVD) for the covariance matrix;
        determining, using the SVD, a plurality of distance values, each distance value representing a respective distance between one of the IC dies and another one of the IC dies; and
        identifying, from the plurality of distance values, at least one family, thereby defining the classification scheme.

7. The computer program product of claim 6, wherein the step of identifying comprises:
    classifying a first IC die of the IC dies in a first family, such that the first family is defined by the first IC die;
    comparing a distance value, from the plurality of distance values, representing a distance between the first IC die and a second IC die of the IC dies with a predetermined threshold;
    if the distance value is less than the predetermined threshold, classifying the second IC die in the first family; and
    if the distance value is greater than the predetermined threshold, classifying the second IC die in a second family, such that the second family is defined by the second IC die.

8. The computer program product of claim 7, wherein the step of identifying further comprises, for each other IC die of the IC dies:
    identifying a group of distance values, from the plurality of distance values, each distance value in the group of distance values representing a distance between the other IC die and a respective IC die of the IC dies that defines a respective family;
    comparing each distance value from the group of distance values with the predetermined threshold;
    if a distance value from the group of distance values, representing a distance between the respective other IC die and a specific IC die of the IC dies that defines a specific family, is less than the predetermined threshold, classifying the other IC die in the specific family; and
    if all the distance values from the group of distance values are greater than the predetermined threshold, classifying the other IC die in a new family, such that the new family is defined by the other IC die.

9. The computer program product of claim 6, wherein the instructions are further configured to normalize the matrix representation prior to computing the covariance matrix.

10. The computer program product of claim 6, wherein the plurality of classification values are based on at least one of:
   simulated values determined from a simulation of the common IC design;
   a plurality of training sensor values collected from the sensors of the common IC design during a pre-production tape-out test; or
   measured sensor values collected from the sensors.

11. The computer program product of claim 6, wherein the step of identifying the classification scheme is part of the step of comparing the plurality of collected sensor values to the classification scheme, thereby enabling the classification of each of the multiple IC dies.

12. The computer program product of claim 6, wherein:
   the plurality of classification values are based on simulated sensor values determined from a simulation of the common IC design;
   the step of determining the classification scheme takes place before the step of comparing the collected at least one sensor value to the classification scheme; and
   the step of comparing the collected at least one sensor value to the classification scheme comprises:
      establishing a collected data matrix representation from the collected sensor values, each row of the matrix representation comprising collected sensor values in respect of one of the IC dies, and
      determining, using the collected data matrix representation, a plurality of collected data distance values, each distance value representing a respective distance between one IC die of the IC dies and another one of the IC dies,
      wherein the classifying is based on the plurality of distance values scheme.

13. The computer program product of claim 12, wherein:
   the step of computing the covariance matrix from the matrix representation comprises normalizing the matrix representation prior to computing the covariance matrix, to define normalization coefficients thereby; and
   the step of establishing the collected data covariance matrix comprises normalizing the matrix representation using the defined normalization coefficients.

14. The computer program product of claim 6, wherein the matrix representation is established from at least one of:
   simulated sensor values determined from a simulation of the common IC design;
   operational parameters determined from a simulation of the common IC design; or
   design signature values.

15. The computer program product of claim 6, wherein the matrix representation is established from Pre-Si (pre-silicon) data, and wherein the step of determining, using the SVD, the plurality of distance values, comprises:
   defining a set of Pre-Si SVD signatures by identifying at least one of the following:
      vectors of the SVD for which the corresponding principal values of the SVD are greater than a pre-defined value, or
      a pre-defined number of vectors of the SVD for which the corresponding principal values of the SVD are the greatest; and
   determining the plurality of distance values using the defined set of Pre-Si SVD signatures.

16. The computer program product of claim 15, wherein the step of determining the plurality of distance values using the defined set of Pre-Si SVD signatures comprises:
   calculating at least some of the plurality of distance values, each of the at least some of the plurality of distance values being based on a distance between one of the Pre-Si SVD signatures and another of the Pre-Si SVD signatures.

17. The computer program product of claim 15, wherein the step of determining the plurality distance values using the defined set of Pre-Si SVD signatures comprises:
   configuring a plurality of estimators from the simulated sensor values and the set of Pre-Si SVD signatures, each estimator generating an estimated SVD signature from input sensor values;
   estimating from the plurality of estimators, for each of the plurality of IC dies, a respective Post-Si SVD signature from the collected sensor values; and
   calculating at least some of the plurality of distance values, each of the at least some of the plurality of distance values being based on a distance between one of the Post-Si SVD signatures and another of the Post-Si SVD signatures.

18. The computer program product of claim 15, wherein the step of determining the plurality distance values using the defined set of Pre-Si SVD signatures further comprises:
   calculating further distance values of the plurality of distance values, each of the further distance values being based on a distance between one of the Pre-Si SVD signatures and one of the Post-Si SVD signatures.

19. A method comprising operating at least one hardware processor to:
   collect at least one sensor value from each of a plurality of sensors that are comprised in multiple Integrated Circuit (IC) dies that are manufactured according to a common IC design, wherein the at least one sensor value is indicative of field performance of the respective IC die; and
   classify each of the multiple IC dies based on the field performance indicated by the at least one sensor value.

20. A computerized system comprising:
   (a) at least one hardware processor; and
   (b) a non-transitory computer-readable storage medium having program code embodied therewith, the program code executable by said at least one hardware processor to:
   collect at least one sensor value from each of a plurality of sensors that are comprised in multiple Integrated Circuit (IC) dies that are manufactured according to a common IC design, wherein the at least one sensor value is indicative of field performance of the respective IC die, and
   classify each of the multiple IC dies based on the field performance indicated by the at least one sensor value.

* * * * *